(12) United States Patent
Fukuda

(10) Patent No.: US 10,461,278 B2
(45) Date of Patent: Oct. 29, 2019

(54) LIGHT-EMITTING DEVICE, DISPLAY APPARATUS, AND ILLUMINATION APPARATUS

(71) Applicant: Sony Corporation, Tokyo (JP)

(72) Inventor: Toshihiro Fukuda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/970,365

(22) Filed: May 3, 2018

(65) Prior Publication Data

US 2018/0254436 A1 Sep. 6, 2018

Related U.S. Application Data

(62) Division of application No. 14/294,940, filed on Jun. 3, 2014, now abandoned.

(30) Foreign Application Priority Data

Jun. 14, 2013 (JP) .................................. 2013-125848

(51) Int. Cl.
*H01L 51/52* (2006.01)
*H01L 51/50* (2006.01)

(52) U.S. Cl.
CPC ........ *H01L 51/5265* (2013.01); *H01L 51/504* (2013.01)

(58) Field of Classification Search
CPC .................. H01L 51/5265; H01L 51/504
See application file for complete search history.

(56) References Cited

U.S. PATENT DOCUMENTS

| | | | |
|---|---|---|---|
| 8,946,684 B2 * | 2/2015 | Fukuda | H01L 51/52 257/40 |
| 2008/0237615 A1 * | 10/2008 | Lee | H01L 51/5265 257/89 |
| 2011/0186878 A1 | 8/2011 | Fukuda et al. | |
| 2012/0098012 A1 | 4/2012 | Kim | |
| 2012/0286300 A1 | 11/2012 | Kijima | |
| 2014/0346480 A1 | 11/2014 | Fukuda et al. | |

FOREIGN PATENT DOCUMENTS

JP 2011-159432 8/2011

OTHER PUBLICATIONS

U.S. Appl. No. 14/278,575; corresponding to US 2014/0346480.

* cited by examiner

*Primary Examiner* — Zandra V Smith
*Assistant Examiner* — Andre C Stevenson
(74) *Attorney, Agent, or Firm* — K&L Gates LLP

(57) ABSTRACT

A light-emitting device includes: a first electrode; a second electrode; and an organic layer that is provided between the first electrode and the second electrode and is formed by stacking a first light-emitting layer and a second light-emitting layer in order from the first electrode side, in which light emitted from the organic layer is reflected by an interface between the first light-emitting layer and the first electrode, passes through the second electrode, and is emitted to the outside of the light-emitting device, a first light-transmitting layer, a second light-transmitting layer, and a third light-transmitting layer are provided on a side of the second light-emitting layer opposite to the first light-emitting layer in order from the second light-emitting layer side, and predetermined conditions are satisfied.

4 Claims, 6 Drawing Sheets

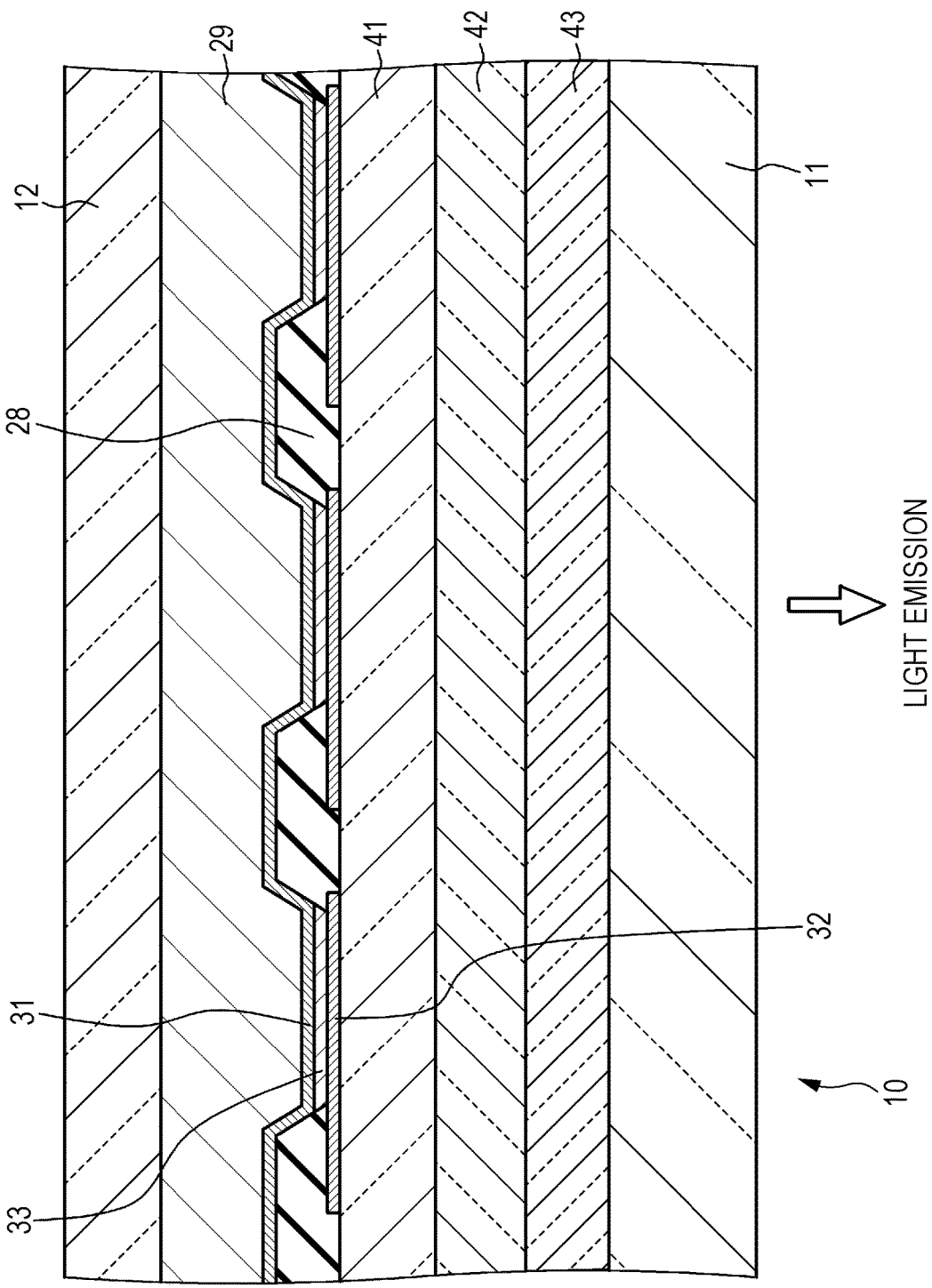

LIGHT-EMITTING DEVICE, DISPLAY APPARATUS, AND ILLUMINATION APPARATUS

CROSS REFERENCES TO RELATED APPLICATIONS

The present application is a divisional application of U.S. patent application Ser. No. 14/294,940, filed on Jun. 3, 2014, which application claims priority to Japanese Priority Patent Application JP 2013-125848 filed in the Japan Patent Office on Jun. 14, 2013, the entire content of which is hereby incorporated by reference.

BACKGROUND

The present disclosure relates to a light-emitting device, and a display apparatus and an illumination apparatus using the light-emitting device.

Organic electroluminescence devices (hereinafter, referred to as "organic EL devices") have attracted attention as light-emitting devices capable of emitting high luminance light at a low voltage DC and have been actively researched and developed. An organic EL device has a structure in which an organic layer including a light-emitting layer which has a thickness of, typically, several tens of nanometers to several hundreds of nanometers is interposed between a reflective electrode and a translucent electrode. Light emitted from the light-emitting layer is extracted to the outside, and an attempt to improve the luminous efficiency of the organic EL device using light interference in a device structure has been made. In addition, as a device capable of improving luminous efficiency and emission lifetime, an organic EL device having a stacked structure (so-called a tandem structure) in which plural light-emitting layers are stacked through a connection layer so as to connect the light-emitting layers to each other in series is well-known, and an arbitrary number of light-emitting layers can be stacked. For example, by stacking a blue light-emitting layer which emits blue light, a green light-emitting layer which emits green light, and a red light-emitting layer which emits red light, white light can be emitted as a combined light of blue light, green light, and red light.

An organic EL device having such a configuration is disclosed in, for example, Japanese Unexamined Patent Application Publication No. 2011-159432. The organic EL device disclosed in Japanese Unexamined Patent Application Publication No. 2011-159432 includes:

an organic layer which is interposed between a first electrode and a second electrode and in which a first light-emitting layer and a second light-emitting layer emitting light of single colors or two or more different colors in a visible wavelength region are sequentially included at mutually separated positions in that order in a direction from the first electrode to the second electrode;

a first reflective interface which is provided on the side of the first electrode so as to reflect light emitted from the first light-emitting layer and the second light-emitting layer to be emitted from the side of the second electrode; and a second reflective interface and a third reflective interface which are sequentially provided on the side of the second electrode at mutually separated positions in that order in a direction from the first electrode to the second electrode, in which when an optical distance between the first reflective interface and a luminescent center of the first light-emitting layer is $L_{11}$, an optical distance between the first reflective interface and a luminescent center of the second light-emitting layer is $L_{21}$, an optical distance between the luminescent center of the first light-emitting layer and the second reflective interface is $L_{12}$, an optical distance between the luminescent center of the second light-emitting layer and the second reflective interface is $L_{22}$, an optical distance between the luminescent center of the first light-emitting layer and the third reflective interface is $L_{13}$, an optical distance between the luminescent center of the second light-emitting layer and the third reflective interface is $L_{23}$, a central wavelength of an emission spectrum of the first light-emitting layer is $\lambda_1$, and a central wavelength of an emission spectrum of the second light-emitting layer is $\lambda_2$, $L_{11}$, $L_{21}$, $L_{12}$, $L_{22}$, $L_{13}$, and $L_{23}$ are chosen so as to satisfy all the expressions (1) to (6) and at least one of the expressions (7) and (8).

$$2L_{11}/\lambda_{11}+\phi_1/2\pi=0 \tag{1}$$

$$2L_{21}/\lambda_{21}+\phi_1/2\pi=n \text{ (where } n\geq 1) \tag{2}$$

$$\lambda_1-150<\lambda_{11}<\lambda_1+80 \tag{3}$$

$$\lambda_2-30<\lambda_{21}<\lambda_2+80 \tag{4}$$

$$2L_{12}/\lambda_{12}+\phi_2/2\pi=m'+\tfrac{1}{2} \text{ and } 2L_{13}/\lambda_{13}+\phi_3/2\pi=m'';$$

$$\text{or } 2L_{12}/\lambda_{12}+\phi_2/2\pi=m' \text{ and } 2L_{13}/\lambda_{13}+\phi_3/2\pi=m''+\tfrac{1}{2} \tag{5}$$

$$2L_{22}/\lambda_{22}+\phi_2/2\pi=n'+\tfrac{1}{2} \text{ and } 2L_{23}/\lambda_{23}+\phi_3/2\pi=n'';$$

$$2L_{22}/\lambda_{22}+\phi_2/2\pi=n' \text{ and } 2L_{23}/\lambda_{23}+\phi_3/2\pi=n''+\tfrac{1}{2}; \text{ or}$$

$$2L_{22}/\lambda_{22}+\phi_2/2\pi=n'+\tfrac{1}{2} \text{ and } 2L_{23}/\lambda_{23}+\phi_3/2\pi=n''+\tfrac{1}{2} \tag{6}$$

$$\lambda_{22}<\lambda_2-15 \text{ or } \lambda_{23}>\lambda_2+15 \tag{7}$$

$$\lambda_{23}<\lambda_2-15 \text{ or } \lambda_{22}>\lambda_2+15 \tag{8}$$

where m', m", n, n', and n" are integers, $\lambda_1$, $\lambda_2$, $\lambda_{11}$, $\lambda_{21}$, $\lambda_{12}$, $\lambda_{22}$, $\lambda_{13}$, and $\lambda_{23}$ are in units of nm, $\phi_1$ is a phase shift occurring when light of each wavelength is reflected by the first reflective interface, $\phi_2$ is a phase shift occurring when light of each wavelength is reflected by the second reflective interface, and $\phi_3$ is a phase shift occurring when light of each wavelength is reflected by the third reflective interface.

By adopting such a configuration, it is possible to realize a light-emitting device capable of effectively extracting light in a wide wavelength region and greatly reducing a viewing-angle dependency of luminance and chromaticity with respect to light of a single color or a combined color of two or more different colors in the visible wavelength region.

In addition, the viewing angle characteristics can be improved by additionally providing a fourth reflective interface in addition to the first, second, and third reflective interfaces. In the fourth reflective interface, depending on the stacking order of two light-emitting layers, a positional condition of the fourth reflective interface under which light rays are reinforced or weakened exists.

SUMMARY

The technique disclosed in Japanese Unexamined Patent Application Publication No. 2011-159432 is extremely useful for flattening characteristics of the interference filter formed by the first reflective interface, the second reflective interface, and the third reflective interface. However, it was found that the flattening of the characteristics of the interference filter alone was not sufficient to further increase color gamut. Japanese Unexamined Patent Application Publication No. 2011-159432 does not describe any countermeasures against the above-described problems.

It is desirable to provide a light-emitting device that includes a first reflective interface, a second reflective interface, and a third reflective interface and is capable of further increasing color gamut using an interference filter formed by the reflective interfaces; and a display apparatus and an illumination apparatus including the light-emitting device.

According to a first embodiment of the present disclosure, there is provided a light-emitting device including:

a first electrode;

a second electrode; and an organic layer that is provided between the first electrode and the second electrode and is formed by stacking a first light-emitting layer and a second light-emitting layer in order from the first electrode side, in which light emitted from the organic layer is reflected by an interface between the first light-emitting layer and the first electrode, passes through the second electrode, and is emitted to the outside of the light-emitting device, a first light-transmitting layer, a second light-transmitting layer, and a third light-transmitting layer are provided on a side of the second light-emitting layer opposite to the first light-emitting layer in order from the second light-emitting layer side, the following expressions (1) and (2) are satisfied, and either or both of the following expressions (3-A) and (3-B) are satisfied.

$$(-\phi_1/2\pi+m_1)\cdot(\lambda_1-150)/2 \leq L_{11} \leq (-\phi_1/2\pi+m_1)\cdot(\lambda_1+80)/2 \quad (1)$$

$$(-\phi_1/2\pi+n_1)\cdot(\lambda_2-30)/2 \leq L_{21} \leq (-\phi_1/2\pi+n_1)\cdot(\lambda_2+80)/2 \quad (2)$$

$$L_{12} \leq (-\phi_2/2\pi+m_2+\tfrac{1}{2})\cdot(\lambda_1+15)/2,\ L_{13} \leq (-\phi_3/2\pi+m_3)\cdot(\lambda_1-15)/2,\ \text{and}\ (-\phi_4/2\pi+m_4)\cdot(\lambda_1-50)/2 \leq L_{14} \quad (3\text{-A})$$

$$L_{22} \leq (-\phi_2/2\pi+n_2+\tfrac{1}{2})\cdot(\lambda_2+15)/2,\ L_{23} \leq (-\phi_3/2\pi+n_3)\cdot(\lambda_2-15)/2,\ \text{and}\ (-\phi_4/2\pi+n_4)\cdot(\lambda_2-50)/2 \leq L_{24} \quad (3\text{-B})$$

Where $\lambda_1$ is a central wavelength (unit: nm) of an emission wavelength region of the first light-emitting layer, $\lambda_2$ is a central wavelength (unit: nm) of an emission wavelength region of the second light-emitting layer, $L_{11}$ is an optical distance (unit: nm) between a first reflective interface, which is the interface between the first light-emitting layer and the first electrode, and a luminescent center of the first light-emitting layer, $L_{12}$ is an optical distance (unit: nm) between a second reflective interface, which is an interface between the second light-emitting layer and the first light-transmitting layer, and the luminescent center of the first light-emitting layer, $L_{13}$ is an optical distance (unit: nm) between a third reflective interface, which is an interface between the first light-transmitting layer and the second light-transmitting layer, and the luminescent center of the first light-emitting layer, $L_{14}$ is an optical distance (unit: nm) between a fourth reflective interface, which is an interface between the second light-transmitting layer and the third light-transmitting layer, and the luminescent center of the first light-emitting layer, $L_{21}$ is an optical distance (unit: nm) between the first reflective interface and a luminescent center of the second light-emitting layer, $L_{22}$ is an optical distance (unit: nm) between the second reflective interface and the luminescent center of the second light-emitting layer, $L_{23}$ is an optical distance (unit: nm) between the third reflective interface and the luminescent center of the second light-emitting layer, $L_{24}$ is an optical distance (unit: nm) between the fourth reflective interface and the luminescent center of the second light-emitting layer, $\phi_1$ is a phase shift (unit: radian) occurring when light is reflected by the first reflective interface, $\phi_2$ is a phase shift (unit: radian) occurring when light is reflected by the second reflective interface, $\phi_3$ is a phase shift (unit: radian) occurring when light is reflected by the third reflective interface, $\phi_4$ is a phase shift (unit: radian) occurring when light is reflected by the fourth reflective interface, $m_1$ is an integer of 0 or more, $n_1$ is an integer of 0 or more, and $m_2$, $m_3$, $m_4$, $n_2$, $n_3$, and $n_4$ are integers.

In addition, the optical distance is also called an optical path length and typically refers to, when light travels through a medium having a refractive index $n_{00}$ by a distance (physical distance) $D_{00}$, a value of $n_{00} \times D_{00}$.

According to a second embodiment of the present disclosure, there is provided a light-emitting device including:

a first electrode;

a second electrode; and an organic layer that is provided between the first electrode and the second electrode and is formed by stacking a first light-emitting layer and a second light-emitting layer in order from the first electrode side, in which light emitted from the organic layer is reflected by a first reflective interface formed between the first light-emitting layer and the first electrode, passes through the second electrode, and is emitted to the outside of the light-emitting device, a first light-transmitting layer, a second light-transmitting layer, and a third light-transmitting layer are provided on a side of the second light-emitting layer opposite to the first light-emitting layer in order from the second light-emitting layer side, a second reflective interface is formed at an interface of the first light-transmitting layer on the second light-emitting layer side, a third reflective interface is formed between the first light-transmitting layer and the second light-transmitting layer, a fourth reflective interface is formed between the second light-transmitting layer and the third light-transmitting layer, an interference filter is formed by the first reflective interface, the second reflective interface, the third reflective interface, and the fourth reflective interface, the first reflective interface is arranged so as to satisfy the following (Condition-1), and the second reflective interface, the third reflective interface, and the fourth reflective interface are arranged so as to satisfy either or both of the following (Condition-2) and (Condition-3).

(Condition-1)

reflection of light rays, which are emitted from the first light-emitting layer, on the first reflective interface is reinforced, and reflection of light rays, which are emitted from the second light-emitting layer, on the first reflective interface is reinforced.

(Condition-2)

reflection of light rays, which are emitted from the first light-emitting layer, on the second reflective interface is weakened, reflection of light rays, which are emitted from the first light-emitting layer, on the third reflective interface is reinforced, and reflection of light rays, which are emitted from the first light-emitting layer, on the fourth reflective interface is reinforced, (Condition-3)

reflection of light rays, which are emitted from the second light-emitting layer, on the second reflective interface is weakened, reflection of light rays, which are emitted from the second light-emitting layer, on the third reflective interface is reinforced, and reflection of light rays, which are emitted from the second light-emitting layer, on the fourth reflective interface is reinforced.

According to another embodiment of the present disclosure, there is provided a display apparatus obtained by arranging the plural light-emitting devices according to the first or second embodiment in a two-dimensional matrix.

According to still another embodiment of the present disclosure, there is provided an illumination apparatus including the light-emitting device according to the first or second embodiment.

In the light-emitting device according to the first embodiment, as described below, an interference filter is formed by the first reflective interface, the second reflective interface, the third reflective interface, and the fourth reflective interface, and a condition under which light rays are reinforced in the interference filter is achieved by satisfying the expressions (1) and (2). By arranging the first reflective interface, the second reflective interface, the third reflective interface, and the fourth reflective interface, an interference filter in which a light transmittance curve is more flat in a wide wavelength region can be obtained. Further, by satisfying either or both of the expression (3-A) and the expression (3-B), a light transmittance of the interference filter can be increased in either or both of a narrow wavelength region corresponding to light emitted from the first light-emitting layer and a narrow wavelength region corresponding to light emitted from the second light-emitting layer. As a result, color gamut can be increased, and a viewing-angle dependency of luminance and chromaticity with respect to light of a single color or a combined color of two or more different colors in the visible wavelength region can be greatly decreased. In addition, in the light-emitting device according to the second embodiment, since the first reflective interface, the second reflective interface, the third reflective interface, and the fourth reflective interface are arranged so as to satisfy the predetermined conditions, an interference filter in which a light transmittance curve is more flat in a wide wavelength region can be obtained. Further, a light transmittance of the interference filter can be increased in either or both of a narrow wavelength region corresponding to light emitted from the first light-emitting layer and a narrow wavelength region corresponding to light emitted from the second light-emitting layer. As a result, color gamut can be increased, and a viewing-angle dependency of luminance and chromaticity with respect to light of a single color or a combined color of two or more different colors in the visible wavelength region can be greatly decreased. The effects described in this specification are merely exemplary, and the content of the present disclosure is not limited thereto. In addition, additional effects may be obtained.

Additional features and advantages are described herein, and will be apparent from the following Detailed Description and the figures.

BRIEF DESCRIPTION OF THE FIGURES

FIG. 5 is a cross-sectional view schematically illustrating a part of a display apparatus of Example 3.

DETAILED DESCRIPTION

Figure 1A:
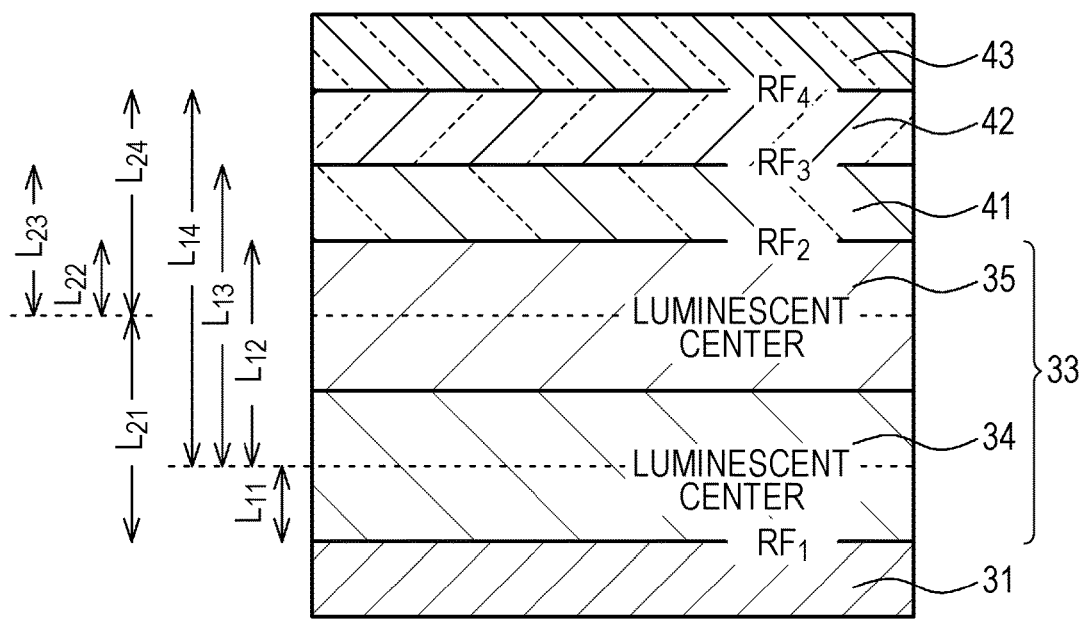
FIGS. 1A and 1B are diagrams illustrating configurations of the respective layers which form light-emitting devices of Example 1 and Comparative Example 1, respectively.

Hereinafter, the present disclosure will be described based on Examples with reference to the accompanying drawings but is not limited to these Examples. Various numerical values and materials in the Examples are merely exemplary. The description will be made in the following order.

1. Overall Description Regarding Light-Emitting Devices According to First and Second Embodiments, Display Apparatus, and Illumination Apparatus
2. Example 1 (Light-Emitting Devices According to First and Second Embodiments and Display Apparatus)
3. Example 2 (Modification of Example 1)
4. Example 3 (Modification of Examples 1 and 2)
5. Example 4 (Illumination Apparatus According to Embodiment) and Others Overall Description Regarding Light-Emitting Devices According to First and Second Embodiments, Display Apparatus, and Illumination Apparatus Regarding the light-emitting device according to the first embodiment, the light-emitting device according the first embodiment in the display apparatus according to the embodiment, and the light-emitting device according to the first embodiment in the illumination apparatus according to the embodiment (hereinafter, these light-emitting devices will also be collectively called "the light-emitting devices according to the first embodiment"), an interference filter may be formed by the first reflective interface, the second reflective interface, the third reflective interface, and the fourth reflective interface. The expression "the interference filter which is formed by the first reflective interface, the second reflective interface, the third reflective interface, and the fourth reflective interface" can be interchangeably used with the expression "the interference filter having a filter effect which is obtained by a spectral transmittance exhibited by interference due to light reflection on the first reflective interface, the second reflective interface, the third reflective interface, and the fourth reflective interface."

In the light-emitting devices according to the first embodiment including the above-described preferred configuration, it is preferable that an optical thickness $t_2$ of the second light-transmitting layer satisfy $0.2 \cdot \lambda_1 \leq t_2 \leq 0.35 \cdot \lambda_1$. Alternatively, it is preferable that the optical thickness $t_2$ satisfy $0.8 \times (\lambda_1/4) \leq t_2 \leq 1.4 \times (\lambda_1/4)$. The optical thickness $t_2$ is obtained from a product of the thickness (physical thickness) of the second light-transmitting layer and a refractive index of the second light-transmitting layer.

Regarding the light-emitting device according to the second embodiment, the light-emitting device according the second embodiment in the display apparatus according to the embodiment, and the light-emitting device according to the second embodiment in the illumination apparatus according to the embodiment (hereinafter, these light-emitting devices will also be collectively called "the light-emitting devices according to the second embodiment"), a position of the second reflective interface may be determined such that a peak position of a light transmittance of the interference filter is shifted from a peak of an emission spectrum of light emitted from the first light-emitting layer and is shifted from a peak of an emission spectrum of light emitted from the second light-emitting layer. In addition, in the light-emitting devices according to the second embodiment including the above-described preferred configurations, a position of the third reflective interface may be determined such that a peak position of a light transmittance of the interference filter is shifted from a peak of an emission spectrum of light emitted from the first light-emitting layer and is shifted from a peak of an emission spectrum of light emitted from the second light-emitting layer. Further, in the light-emitting devices according to the second embodiment including the above-described preferred configuration, a position of the fourth reflective interface may determined such that a peak position of a light transmittance of the interference filter is shifted from a peak of an emission spectrum of light emitted from the first light-emitting layer and is shifted from a peak of an emission spectrum of light emitted from the second light-emitting layer. As a result, the interference filter can function in a wider region. The same shall be applied to the light-emitting devices according to the first embodiment.

Further, in the light-emitting devices according to the first or second embodiment including the above-described various preferred configurations, it is preferable that a luminance at a viewing angle of 45° be decreased by 30% or lower compared to a luminance ($Y_0$) at a viewing angle of 0°.

Further, in the light-emitting devices according to the first or second embodiment including the above-described various preferred configurations, it is preferable that a chromaticity shift Δuv at a viewing angle of 45° be 0.015 or lower.

Further, in the light-emitting devices according to the first or second embodiment including the above-described various preferred configurations, a metal layer having a thickness of 5 nm or less may be provided between the second light-emitting layer and the first light-transmitting layer. In this configuration, as a material forming the metal layer, for example, magnesium (Mg), silver (Ag), or an alloy thereof can be used. Light emitted from the organic layer passes through the metal layer.

Further, in the light-emitting devices according to the first or second embodiment including the above-described various preferred configurations, the second reflective interface, the third reflective interface, or the fourth reflective interface may include plural interfaces.

Further, in the light-emitting devices according to the first embodiment including the above-described various preferred configurations, at least one of the first light-emitting layer and the second light-emitting layer may be a heterochromatic light-emitting layer that emits light of two or more different colors, and when it is determined that luminescent centers of the heterochromatic light-emitting layer are not at one level, a fourth light-transmitting layer may be further provided. The expression "it is determined that luminescent centers of the heterochromatic light-emitting layer are not at one level" implies that, for example, the distance between a luminescent center of a first color and a luminescent center of a second color of the heterochromatic light-emitting layer is 5 nm or greater. In this configuration, it is preferable that an interference filter be formed by the first reflective interface, the second reflective interface, the third reflective interface, the fourth reflective interface, and a fifth reflective interface; that the first reflective interface be the interface between the first light-emitting layer and the first electrode; that the second reflective interface be formed by the second light-emitting layer, the first light-transmitting layer, the second light-transmitting layer, the third light-transmitting layer, and the fourth light transmitting layer; and that a change of a light transmittance curve of a light ray, which is emitted from the heterochromatic light-emitting layer to the outside of the light-emitting device, in the interference filter in which a wavelength is used as a variable have the same tendency as that of a change of a light transmittance curve of another light ray, which is emitted from the heterochromatic light-emitting layer to the outside of the light-emitting device, in the interference filter in which a wavelength is used as a variable. With this configuration, a viewing-angle dependency of luminance and chromaticity with respect to light of a single color or a combined color of two or more different colors in the visible wavelength region can be greatly decreased. Further, in the light-emitting devices according to the second embodiment including the above-described various preferred configurations, at least one of the first light-emitting layer and the second light-emitting layer may be a heterochromatic light-emitting layer that emits light of two or more different colors, and when it is determined that luminescent centers of the heterochromatic light-emitting layer are not at one level, a fourth light-transmitting layer may be further provided. In this configuration, it is preferable that the fourth light-transmitting layer be further provided; and that a change of a light transmittance curve of a light ray, which is emitted from the heterochromatic light-emitting layer to the outside of the light-emitting device, in the interference filter in which a wavelength is used as a variable have the same tendency as that of a change of a light transmittance curve of another light ray, which is emitted from the heterochromatic light-emitting layer to the outside of the light-emitting device, in the interference filter in which a wavelength is used as a variable.

Further, in the light-emitting devices according to the first or second embodiment including the above-described various preferred configurations, the first electrode, the organic layer, and the second electrode may be stacked in this order on a substrate (for convenience of description, also referred to as "first substrate"). For convenience of description, this configuration will be referred to as "top emission type". In this case, a transparent conductive material layer having a thickness of 0.5 μm or greater, a transparent insulating layer having a thickness of 0.5 μm or greater, a resin layer having a thickness of 0.5 μm or greater, a glass layer having a thickness of 0.5 μm or greater, or an air layer having a thickness of 0.5 μm or greater may be further formed on a side of the third light-transmitting layer opposite to the second light-transmitting layer. The outermost layer above the second electrode is a second substrate.

Alternatively, in the light-emitting devices according to the first or second embodiment including the above-described various preferred configurations, the second electrode, the organic layer, and the first electrode are stacked in this order on the first substrate. For convenience of description, this configuration will be referred to as "bottom emission type." In this case, a transparent conductive material layer having a thickness of 1 μm or greater, a transparent insulating layer having a thickness of 1 μm or greater, a resin layer having a thickness of 1 μm or greater, a glass layer having a thickness of 1 μm or greater, or an air layer having a thickness of 1 μm or greater may be formed on a side of the third light-transmitting layer opposite to the second light-transmitting layer. Typically, the outermost layer above the first electrode is the second substrate.

Typically, a part of incident light rays passes through a reflective interface which is formed between layers A and B formed of a transparent material and the other light rays are reflected by the reflective interface. Accordingly, a phase shift occurs in the reflected light. A phase shift $\phi_{AB}$ occurring when light is reflected by the reflective interface formed between the layers A and B can be obtained by measuring a complex refractive index $(n_A, k_A)$ of the layer A and a complex refractive index $(n_B, k_B)$ of the layer B and performing a calculation based on these values (for example, refer to Principles of Optics, Max Born and Emil Wolf, 1974 (PERGAMON PRESS)). The refractive indices of the organic layer and the respective light-transmitting layers can be measured using a spectroscopic ellipsometer.

The top emission type display apparatus may have a configuration in which the organic layer emits white light, and the second substrate includes a color filter. The second substrate may include a light-shielding film (black matrix). Likewise, the bottom emission type display apparatus may have a configuration in which the organic layer emits white light, and the first substrate includes a color filter or a light-shielding film (black matrix).

In the display apparatus according to the embodiment, in a configuration in which one pixel (or one sub-pixel) is formed by one light-emitting device, a pixel (or sub-pixel) arrangement is not particularly limited but, for example, may be a stripe arrangement, a diagonal arrangement, a delta arrangement, and a rectangular arrangement. In addition, in a configuration in which one pixel (or one sub-pixel) is formed by plural light-emitting devices, a pixel (or sub-pixel) arrangement is not particularly limited but, for example, may be a stripe arrangement.

When the first electrode functions as an anode electrode, examples of a material (light reflective material) forming the first electrode include metals having a high work function such as platinum (Pt), gold (Au), silver (Ag), chromium (Cr), tungsten (W), nickel (Ni), copper (Cu), iron (Fe), cobalt (Co), or tantalum (Ta); and alloys thereof (for example, an Ag—Pd—Cu alloy including silver as a major component, 0.3 mass % to 1 mass % of palladium (Pd), and 0.3 mass % to 1 mass % of copper (Cu) or an Al—Nd alloy). Further, when a conductive material, such as aluminum (Al) and an alloy including aluminum, having a low work function and a high light reflectance is used, the first electrode can be used as an anode electrode by, for example, providing an appropriate hole injection layer to improve a hole injection property. The thickness of the first electrode is, for example, 0.1 μm to 1 μm. Alternatively, a structure may also be adopted in which a transparent conductive material having a high hole injection property such as an oxide (ITO) of indium and tin or an oxide (IZO) of indium and zinc is stacked on a dielectric multi-layer film or a reflective film having a high light reflectance such as aluminum (Al). On the other hand, when the first electrode functions as a cathode electrode, it is preferable that a conductive material having a low work function and a high light reflectance be used. The first electrode can be used as a cathode electrode by, for example, providing an appropriate electron injection layer on a conductive material having a high light reflectance, which is used as an anode electrode, to improve an electron injection property.

On the other hand, regarding a material (a semi-transmissive material or a transmissive material) forming the second electrode, when the second electrode functions as a cathode electrode, it is preferable that the second electrode be formed of a conductive material through which emitted light pass and which has a low work function such that electrons can be effectively injected into the organic layer. Examples of the conductive material include metals having a low work function and alloys thereof, for example, aluminum (Al), silver (Ag), magnesium (Mg), calcium (Ca), sodium (Na), strontium (Sr), alloys of silver (Ag) and alkali metals or alkali earth metals (for example, an alloy (Mg—Ag alloy) of magnesium (Mg) and silver (Ag)), alloys (Mg—Ca alloy) of magnesium and calcium, or alloys (Al—Li alloy) of aluminum (Al) and lithium (Li). Among these, an Mg—Ag alloy is preferable, and a volume ratio of magnesium to silver (Mg:Ag) is, for example, 2:1 to 30:1. Alternatively, a volume ratio of magnesium to calcium (Mg:Ca) is, for example, 2:1 to 10:1. The thickness of the second electrode is, for example, 4 nm to 50 nm, preferably 4 nm to 20 nm, and more preferably 6 nm to 12 nm. Alternatively, the second electrode may have a stacked structure in which the above-described material layer and a so-called transparent electrode (having a thickness of, for example, $3 \times 10^{-8}$ m to $1 \times 10^{-6}$ m) formed of, for example, ITO or IZO are stacked in order from the organic layer side. In the case of the stacked structure, the thickness of the above-described material layer can be reduced to 1 nm to 4 nm. In addition, the second electrode may also be formed of only the transparent electrode. On the other hand, when the second electrode functions as an anode electrode, it is preferable that the second electrode be formed of a conductive material through which emitted light pass and which has a high work function.

By the second electrode having the above-described configuration, the first light-transmitting layer may be formed, the second light-transmitting layer may be formed, or the third light-transmitting layer may be formed. Alternatively, the second electrode may be provided independently of the first light-transmitting layer, the second light-transmitting layer, and the third light-transmitting layer. In addition, a bus electrode (auxiliary electrode) formed of a low-resistance material such as aluminum, an aluminum alloy, silver, a silver alloy, copper, a copper alloy, gold, or a gold alloy may be provided on the second electrode to reduce the total resistance of the second electrode.

Examples of a method of forming the first electrode or the second electrode include combinations of an deposition method such as an electron beam deposition method, a hot filament deposition method, or a vacuum deposition method, a sputtering method, a chemical vapor deposition (CVD) method, an MOCVD method, and an ion plating method with an etching method; various printing methods such as a screen printing method, an ink jet printing method, and a metal-mask printing method; plating methods such as an electrical plating method or a non-electrolytic plating method; a lift-off method; a laser abrasion method; and a sol-gel method. According to various printing methods and plating methods, the first electrode or the second electrode having a desired pattern can be directly formed. When the first electrode or the second electrode is formed after forming the organic layer, it is preferable that the first electrode or the second electrode be formed, particularly, using a film forming method, such as a vacuum deposition method, in which the energy of film forming particles is low or using a film forming method such as a MOCVD method from the viewpoint of preventing the organic layer from being damaged. When the organic layer is damaged, non-light-emitting pixels (non-light-emitting sub-pixels) called "dark spots" may be generated due to a leakage current. In addition, it is preferable that the organic layer and these electrodes be formed without being exposed to the air from the viewpoint of preventing the organic layer from deteriorating due to moisture in the air. In some cases, either the first electrode or the second electrode is not necessarily patterned.

In the display apparatus or the illumination apparatus according to the embodiment (hereinafter, these apparatuses will also be referred to as "the display apparatus or the like according to the embodiment"), plural light-emitting devices are formed on the first substrate. In this configuration, examples of the first substrate or the second substrate include a high strain point glass substrate, a soda-lime glass ($Na_2O.CaO.SiO_2$) substrate, a borosilicate glass ($Na_2O.B_2O_3.SiO_2$) substrate, a forsterite ($2MgO.SiO_2$) substrate, a lead glass ($Na_2O.PbO.SiO_2$) substrate, an alkali-free glass substrate, various glass substrates on which an insulating film is formed, a fused silica glass substrate, a quartz substrate on which an insulating film is formed, a silicon substrate on which an insulating film is formed, and a substrate of an organic polymer (substrate in the form of a polymer material, for example, an flexible plastic film, plastic sheet, or plastic substrate formed of a polymer material) such as polymethyl methacrylate (PMMA), polyvinyl alcohol (PVA), polyvinyl phenol (PVP), polyester sulfone (PES), polyimide, polycarbonate, or polyethylene terephthalate (PET). The material forming the first electrode and the material forming the second electrode may be the same as or different from each other. However, in the top emission type display apparatus, it is necessary that the second electrode be transparent to light emitted from the light-emitting devices, and in the bottom emission type display apparatus, it is necessary that the first electrode be transparent to light emitted from the light-emitting devices.

Examples of the display apparatus or the like according to the embodiment include an organic electroluminescence display apparatus (abbreviated to "organic EL display apparatus"). When the organic EL display apparatus is a color organic EL display apparatus, sub-pixels are formed by respective organic EL devices included in the organic EL display apparatus, as described above. In this case, as described above, one pixel is formed by, for example, three kinds of sub-pixels including a red light-emitting sub-pixel which emits red light, a green light-emitting sub-pixel which emits green light, and a blue light-emitting sub-pixel which emits blue light. Accordingly, in this case, when the number of organic EL devices included in the organic EL display apparatus is N×M, the number of pixels is (N×M)/3. The organic EL display apparatus can be used as a monitor configuring a personal computer or as a monitor incorporated into a television receiver, a mobile phone, a personal digital assistant (PDA), or a game machine. Alternatively, the organic EL display apparatus can be applied to an electronic view finder (EVF) or a head mounted display (HMD). In addition, examples of the illumination apparatus according to the embodiment include a backlight unit for a liquid crystal display and an illumination apparatus including a surface emission light source.

The organic layer includes a light-emitting layer (for example, a light-emitting layer formed of an organic luminescent material) and, specifically, may have a stacked structure in which a hole transport layer, a light-emitting layer, and an electron transport layer are stacked, a stacked structure in which a hole transport layer and a light-emitting layer also functioning as an electron transport layer are stacked, and a stacked structure in which a hole injection layer, a hole transport layer, a light-emitting layer, an electron transport layer, and an electron injection layer are stacked. These stacked structures are called "tandem units". That is, the organic layer may have a two-stage tandem structure in which a first tandem unit, a connection layer, and a second tandem unit are stacked or a three- or more-stage tandem structure in which three or more tandem units are stacked. In these cases, the organic layer which emits white light as a whole can be obtained by changing emission colors into red, green, and blue through the respective tandem units or by changing emission colors into, for example, blue and yellow through the respective tandem units. Examples of a method of forming the organic layer include a physical vapor deposition (PVD) method such as a vacuum deposition method; a printing method such as a screen printing method or an ink jet printing method; a laser transfer method of irradiating a stacked structure in which a laser absorption layer and an organic layer are stacked on a transfer substrate with laser to separate the organic layer from the laser absorption layer and transfer the organic layer; and various coating methods. When the organic layer is formed using a vacuum deposition method, the organic layer can be obtained by, for example, using a so-called metal mask to deposit a material through an opening provided in the metal mask. The organic layer may be formed on the entire surface without patterning.

In the top emission type display apparatus or the like, the first electrode is provided, for example, on an interlayer dielectric. This interlayer dielectric covers a light-emitting device driving portion formed on the first substrate. The light-emitting device driving portion includes one or plural thin film transistors (TFT), and the TFT and the first electrode are electrically connected to each other through a contact plug provided in the interlayer dielectric. Examples of a material forming the interlayer dielectric include $SiO_2$-based materials such as $SiO_2$, BPSG, PSG, BSG, AsSG, PbSG, SiON, spin on glass (SOG), low-melting-point glass, or glass paste; SiN-based materials; and insulating resins such as polyimide resins, novolac resins, acrylic resins, or polybenzooxazole. These materials can be appropriately used alone or in a combination of two or more kinds. In order to form the interlayer dielectric, an existing process such as a CVD method, a coating method, a sputtering method, or various printing methods can be used. In the bottom emission type display apparatus or the like having a configuration or a structure in which light emitted from the light-emitting devices passes through the interlayer dielectric, it is necessary that the interlayer dielectric be formed of a material which is transparent to light emitted from the light-emitting devices; and that the light-emitting device driving portion be formed so as not to interfere light emitted from the light-emitting devices. In the bottom emission type display apparatus or the like, the light-emitting device driving portion can be provided above the first electrode.

In order to prevent moisture from infiltrating inside the organic layer, it is preferable that an insulating or conductive protective film be provided above the organic layer. It is preferable that the protective film be formed, particularly, using a film forming method, such as a vacuum deposition method, in which the energy of film forming particles is low or using a film forming method such as a CVD method or a MOCVD method because an effect thereof on an undercoat layer can be reduced. Alternatively, in order to prevent luminance from being decreased by deterioration of the organic layer, it is preferable that a film forming temperature be set to normal temperature. Further, in order to prevent the protective film from being peeled off, it is preferable that the protective film be formed under conditions where the stress of the protective film is minimized. In addition, it is preferable that the protective film be formed without the already-formed electrodes being exposed to the air. As a result, deterioration of the organic layer caused by moisture and oxygen in the air can be prevented. Further, when the display apparatus or the like is the top emission type, it is preferable that the protective film be formed of a material through which 80% or higher of light emitted from the organic layer passes. Specifically, for example, inorganic amorphous insulating materials such as the following materials can be used. Since such inorganic amorphous insulating materials do not form grains, a superior protective film having low water-permeability can be formed. Specifically, as a material forming the protective film, it is preferable that a material which is transparent to light emitted from the light-emitting layers, is dense, and is moisture-proof be used. More specifically, examples of the material include amorphous silicon (α-Si), amorphous silicon carbide (α-SiC), amorphous silicon nitride (α-Si$_{1-x}$N$_x$), amorphous silicon oxide (α-Si$_{1-y}$O$_y$), amorphous carbon (α-C), amorphous silicon nitride oxide (α-SiON), and Al$_2$O$_3$. When the protective film is formed of a conductive material, the protective film may be formed of a transparent conductive material such as ITO or IZO. At least one layer of the first light-transmitting layer, the second light-transmitting layer, and the third light-transmitting layer may be formed of the protective film.

Examples of a material forming the first light-transmitting layer, the second light-transmitting layer, or the third light-transmitting layer include, in addition to the above-described various materials, metal oxides such as molybdenum oxide, niobium oxide, zinc oxide, or tin oxide; and various organic materials.

Example 1

Figure 2:
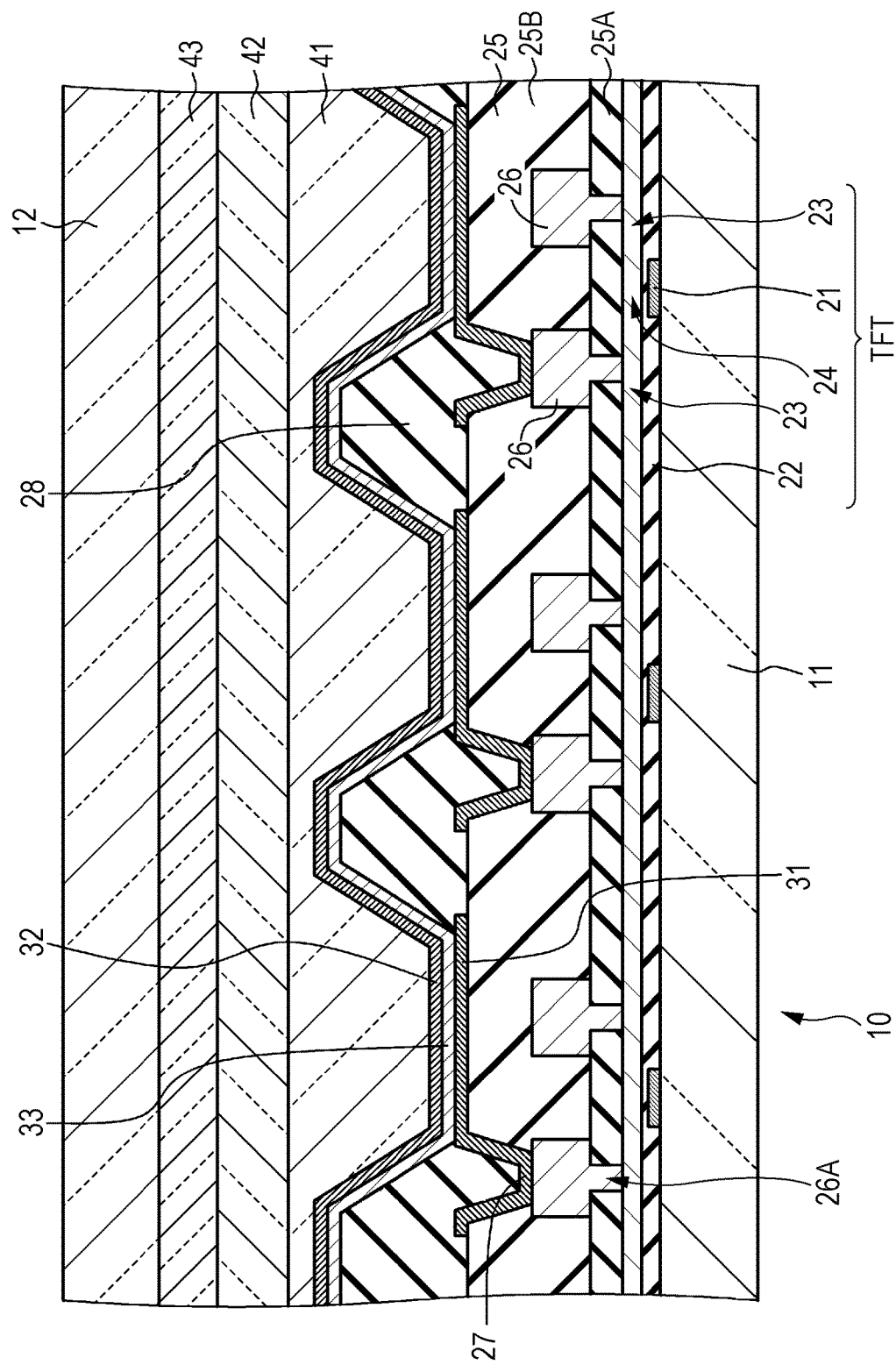
FIG. 2 is a cross-sectional view schematically illustrating a part of a display apparatus of Example 1.

Example 1 relates to the light-emitting devices according to the first and second embodiments and the display apparatus according to the embodiment. FIG. 1A is a diagram illustrating configurations of respective layers which forms the light-emitting device of Example 1, and FIG. 2 is a cross-sectional view schematically illustrating a part of the display apparatus of Example 1.

The light-emitting device 10 of Example 1, that is, the organic EL device 10 includes:
a first electrode 31;
a second electrode 32; and
an organic layer 33 that is provided between the first electrode 31 and the second electrode 32 and is formed by stacking a first light-emitting layer 34 and a second light-emitting layer 35 in order from the first electrode side,
in which light emitted from the organic layer 33 is reflected by an interface (first reflective interface RF$_1$) between the first light-emitting layer 34 and the first electrode 31, passes through the second electrode 32, and is emitted to the outside of the light-emitting device,
a first light-transmitting layer 41, a second light-transmitting layer 42, and a third light-transmitting layer 43 are provided on a side of the second light-emitting layer 35 opposite to the first light-emitting layer 34 in order from the second light-emitting layer side.

Alternatively, the light-emitting device 10 of Example 1, that is, the organic EL device 10 includes:
a first electrode 31;
a second electrode 32; and
an organic layer 33 that is provided between the first electrode 31 and the second electrode 32 and is formed by stacking a first light-emitting layer 34 and a second light-emitting layer 35 in order from the first electrode side,
in which light emitted from the organic layer 33 is reflected by a first reflective interface RF$_1$ formed between the first light-emitting layer 34 and the first electrode 31, passes through the second electrode 32, and is emitted to the outside of the light-emitting device,
a first light-transmitting layer 41, a second light-transmitting layer 42, and a third light-transmitting layer 43 are provided on a side of the second light-emitting layer 35 opposite to the first light-emitting layer 34 in order from the second light-emitting layer side,
a second reflective interface RF$_2$ is formed at an interface of the first light-transmitting layer 41 on the second light-emitting layer side,
a third reflective interface RF$_3$ is formed between the first light-transmitting layer 41 and the second light-transmitting layer 42,
a fourth reflective interface RF$_4$ is formed between the second light-transmitting layer 42 and the third light-transmitting layer 43,
an interference filter is formed by the first reflective interface RF$_1$, the second reflective interface RF$_2$, the third reflective interface RF$_3$, and the fourth reflective interface RF$_4$,
the first reflective interface RF$_1$ is arranged so as to satisfy the above-described (Condition-1), and
the second reflective interface RF$_2$, the third reflective interface RF$_3$, and the fourth reflective interface RF$_4$ are arranged so as to satisfy either or both of the above-described (Condition-2) and (Condition-3).

In addition, an organic EL display apparatus of Example 1 or any one of Examples 2 and 3 described below is formed by arranging such plural light-emitting devices in a two-dimensional matrix. The first electrode 31, the organic layer 33, and the second electrode 32 are stacked in this order on a first substrate 11. That is, specifically, two substrates are provided, the two substrates including:
(A) the first substrate 11 on which plural light-emitting devices 10 formed by stacking the first electrode 31, the organic layer 33 including the first light-emitting layer 34 and the second light-emitting layer 35 which are formed of an organic luminescent material, and the second electrode 32 are formed; and
(B) a second substrate 12 that is disposed above the second electrode 32.

Light emitted from the light-emitting layer is emitted to the outside through the second substrate 12. That is, the display apparatus of Example 1 is the top emission type display apparatus. A metal layer (not illustrated) formed of magnesium (Mg), silver (Ag), or an alloy thereof and having a thickness of 5 nm or less is provided between the second light-emitting layer 35 and the first light-transmitting layer 41 (specifically, between the organic layer 33 and the second electrode 32), but the display apparatus is not limited to this configuration.

Although not illustrated, a transparent conductive material layer having a thickness of 0.5 μm or greater, a transparent insulating layer having a thickness of 0.5 μm or greater, a resin layer having a thickness of 0.5 μm or greater, a glass layer having a thickness of 0.5 μm or greater, or an air layer having a thickness of 0.5 μm or greater may be further formed on a side of the third light-transmitting layer 43 opposite to the second light-transmitting layer 42, that is, may be further formed between the third light-transmitting layer 43 and the second substrate 12. The outermost layer above the second electrode 32 is the second substrate 12.

The organic EL display apparatus of Example 1 or any one of Examples 2 and 3 described below is a high-definition display apparatus which is applied to an electronic view finder (EVF) or a head mounted display (HMD). Alternatively, for example, the organic EL display can be applied to a large organic EL display apparatus such as a television receiver.

One pixel is formed by three sub-pixels including a red light-emitting sub-pixel which emits red light, a green light-emitting sub-pixel which emits green light, and a blue light-emitting sub-pixel which emits blue light. The second substrate 12 may include a color filter (not illustrated). The light-emitting device 10 emits white light, and each color light-emitting sub-pixel is formed by a combination of the light-emitting device 10 emitting white light with the color filter. The color filter includes a region transmitting red light, a region transmitting green light, and a region transmitting blue light. In addition, a light-shielding film (black matrix) may be provided between color filters. The number of pixels is, for example, 1920×1080, one light-emitting device 10 forms one sub-pixel, and the number of light-emitting devices (specifically, organic EL devices) 10 is three times the number of pixels. When the color filter is not provided, the display apparatus is a so-called monochrome display apparatus.

In Example 1, $m_1=0$ and $n_1=1$. In addition, refractive indices $n_{00}$, $n_{01}$, $n_{02}$, and $n_{03}$ of the organic layer 33, the first light-transmitting layer 41, the second light-transmitting layer 42, and the third light-transmitting layer 43 and various parameters are as shown below in Table 1. Specifically, the first light-emitting layer 34 is a blue light-emitting layer which emits blue light, and the second light-emitting layer 35 is a yellow light-emitting layer which emits yellow light. The average values of the emission wavelengths are as shown below in Table 1.

In addition, although described below in detail, an interference filter is formed by the first reflective interface $RF_1$, the second reflective interface $RF_2$, the third reflective interface $RF_3$, and the fourth reflective interface $RF_4$.

In Example 1 or any one of Examples 2 and 3 described below, the first electrode 31 is used as an anode electrode, and the second electrode 32 is used as a cathode electrode. The first electrode 31 is formed of a light reflective material, specifically, an Al—Nd alloy, and the second electrode 32 is formed of a transparent conductive material. The first electrode 31 is formed, particularly, using a combination of a vacuum deposition method with an etching method. In addition, the second electrode 32 is formed using a film forming method, such as a vacuum deposition method, in which the energy of film forming particles is low, and is not patterned.

In Example 1 or any one of Examples 2 and 3 described below, the first electrode 31 included in the light-emitting device (organic EL device) 10 is provide on an interlayer dielectric 25 (more specifically, an upper interlayer dielectric 25B) which is formed of SiON using a CVD method. This interlayer dielectric 25 (more specifically, a lower interlayer dielectric 25A) covers an organic EL device driving portion formed on the first substrate 11. The organic EL light-emitting device driving portion includes plural TFTs, and the TFT and the first electrode 31 are electrically connected through a contact plug 27, an interconnection 26, and a contact plug 26A which are provided in the interlayer dielectric (more specifically, the upper interlayer dielectric 25B). An actual light-emitting portion of the organic layer 33 is surrounded by an insulating layer 28. In the drawing, one TFT is illustrated for one organic EL device driving portion. The TFT includes a gate electrode 21 that is formed on the first substrate 11, a gate insulating film 22 that is formed on the first substrate 11 and the gate electrode 21, a source/drain region 23 that is provided on a semiconductor layer formed on the gate insulating film 22, and a channel forming region 24 that is provided between source/drain regions 23 and corresponds to a semiconductor portion positioned above the gate electrode 21. In the illustrated example, the TFT is a bottom gate type but may be a top gate type. The gate electrode 21 of the TFT is connected to a scanning circuit (not illustrated).

In Example 1 or any one of Examples 2 and 3 described below, the first substrate 11 is a silicon substrate, an alkali-free glass, or a fused silica glass substrate, and the second substrate 12 is an alkali-free glass substrate or a fused silica glass substrate.

More specifically, the organic layer 33 has the following configuration or structure, but such a configuration or structure is exemplary and can be appropriately changed. The thickness of a hole injection layer is, for example, 1 nm to 20 nm, the thickness of a hole transport layer is, for example, 15 nm to 100 nm, the thickness of a light-emitting layer is, for example, 5 nm to 50 nm, and the thickness of an electron transport layer is, for example, 15 nm to 200 nm.

A buffer layer included in the organic layer 33 is formed on the first electrode 31. The buffer layer is provided for preventing leakage and is formed of, for example, hexaazatriphenylene (HAT). A hole transport layer formed of, for example, α-NPD (N,N'-di(1-naphthyl)-N,N'-diphenyl-[1,1'-biphenyl]-4,4'-diamine) is formed on the buffer layer. A blue light-emitting layer (thickness: 20 nm) is formed on the hole transport layer. The blue light-emitting layer can be obtained by depositing ADN as a host material and doping the ADN with a diaminochrysene derivative as a dopant material at a relative film thickness ratio of 5%. Further, an electron transport layer formed of BCP (2,9-dimethyl-4,7-diphenyl-1,10-phenanthroline) or the like and an electron injection layer formed of lithium fluoride (LiF) or the like are formed on the blue light-emitting layer. With the above-described stacked structure, the first light-emitting layer 34 is formed.

A connection layer formed of Alq3 (tris(8-quinolinolato) aluminum(III)) doped with 5% of Mg or formed of HAT is formed on the first light-emitting layer 34.

A hole injection layer also functioning as a hole transport layer which is formed of α-NPD is formed on the connection layer. A yellow light-emitting layer (thickness: 20 nm) which is formed of a luminescent material emitting yellow light is formed on the hole injection layer. The yellow light-emitting layer can be obtained by depositing CBP as a host material and doping the CBP with a FIrpic derivative as a dopant material at a relative film thickness ratio of 10%. Further, an electron transport layer formed of BCP or the like and an electron injection layer formed of lithium fluoride (LiF) are formed on the yellow light-emitting layer. With the above-described stacked structure, the second light-emitting layer 35 is formed.

Since the above-described light-emitting device can be manufactured using an existing method, the details of the manufacturing method will not be described.

The light-emitting device 10 of Example 1 satisfies the above-described expressions (1) and (2) and satisfies either or both of the expressions (3-A) and (3-B). More specifically, in Example 1, the expression (3-B) is satisfied. By satisfying the expression (3-A) or an expression (C-1) described below, a light transmittance of the interference filter can be increased in a narrow wavelength region corresponding to light emitted from the first light-emitting layer. By satisfying the expression (3-B) or an expression (C-2) described below, a light transmittance of the interference filter can be increased in a narrow wavelength region corresponding to light emitted from the second light-emitting layer. By satisfying the expressions (3-A) and (3-B) or the expressions (C-1) and (C-2) described below, a light transmittance of the interference filter can be increased in a narrow wavelength region corresponding to light emitted from both the first light-emitting layer and the second light-emitting layer. Whether to adopt the expression (3-A) or the expression (C-1) described below, whether to adopt the expression (3-B) or the expression (C-2) described below, and whether to adopt the expressions (3-A) and (3-B) or the expressions (C-1) and (C-2) described below are all pertaining to design matters. As such, depending on the emission spectrum and the emission position, these expressions can be adopted independently of each other.

Other expressions which can express the above expressions are as follows.

That is, when $$\lambda_1 - 150 \leq \lambda_{11} \leq \lambda_1 + 80;$$

$$\lambda_2 - 30 \leq \lambda_{21} \leq \lambda_2 + 80;$$

$$\lambda_{12} \leq \lambda_1 + 15, \lambda_{13} \leq \lambda_1 - 15, \text{ and } \lambda_1 - 50 \leq \lambda_{14}; \text{ and}$$

$$\lambda_{22} \leq \lambda_2 + 15, \lambda_{23} \leq \lambda_2 - 15, \text{ and } \lambda_2 - 50 \leq \lambda_{24},$$

the expressions (A) and (B) are satisfied, and
either or both of the expressions (C-1) and (C-2) are satisfied. In this case, an optical distance L is a value calculated in consideration of a wavelength dependency of a refractive index of a medium through which light is transmitted.

$$2 \cdot L_{11}/\lambda_{11} + \phi_1/2\pi = m_1 \qquad (A)$$

$$2 \cdot L_{21}/\lambda_{21} + \phi_1/2\pi = n_1 \qquad (B)$$

$$2 \cdot L_{12}/\lambda_{12} + \phi_2/2\pi = m_2 + \tfrac{1}{2},\ 2 \cdot L_{13}/\lambda_{13} + \phi_3/2\pi = m_3, \text{ and}$$
$$2 \cdot L_{14}/\lambda_{14} + \phi_4/2\pi = m_4 \qquad (C\text{-}1)$$

$$2 \cdot L_{22}/\lambda_{22} + \phi_2/2\pi = n_2 + \tfrac{1}{2},\ 2 \cdot L_{23}/\lambda_{23} + \phi_3/2\pi = n_3, \text{ and}$$
$$2 \cdot L_{24}/\lambda_{24} + \phi_4/2\pi = n_4 \qquad (C\text{-}2)$$

TABLE 1

| |
|---|
| $n_{00}$: 1.75 |
| $n_{01}$: 2.30 |
| $n_{02}$: 1.80 |
| $n_{03}$: 2.00 |
| $\lambda_1$: 460 nm |
| $\lambda_2$: 560 nm |
| $L_{11}$: 72 nm |
| $L_{12}$: 582 nm |
| $L_{13}$: 1065 nm |
| $L_{14}$: 1686 nm |
| $L_{21}$: 389 nm |
| $L_{22}$: 267 nm |
| $L_{23}$: 750 nm |
| $L_{24}$: 1371 nm |

A difference between the refractive index $n_{00}$ of the organic layer 33 and the refractive index $n_{01}$ of the first light-transmitting layer 41 is 0.15 or greater, a difference between the refractive index $n_{01}$ of the first light-transmitting layer 41 and the refractive index $n_{02}$ of the second light-transmitting layer 42 is 0.15 or greater, and a difference between the refractive index $n_{02}$ of the second light-transmitting layer 42 and the refractive index $n_{03}$ of the third light-transmitting layer 43 is 0.15 or greater. In addition, the optical thickness $t_2$ of the second light-transmitting layer is $t_2 \cong (\tfrac{1}{4})\lambda_1$ and satisfies $0.2 \cdot \lambda_1 \leq t_2 \leq 0.35 \cdot \lambda_1$ and $0.8 \times (\lambda_1/4) \leq t_2 \leq 1.4 \times (\lambda_1/4)$.

As a result, the following expressions are satisfied.

$$2 \cdot L_{11}/\lambda_{11} + \phi_1/2\pi = 0$$

$$2 \cdot L_{21}/\lambda_{21} + \phi_1/2\pi = 1$$

where
$\lambda_1 - 150 = 310$ nm $\leq \lambda_{11} = 480$ nm $\leq \lambda_1 + 80 = 540$ nm; and
$\lambda_2 - 30 = 530$ nm $\leq \lambda_{21} = 570$ nm $\leq \lambda_2 + 80 = 640$ nm Accordingly, the expressions (A) and (B), that is, the expressions (1) and (2) are satisfied.

In addition, values such as $\lambda_{11} = 480$ nm or $\lambda_{21} = 570$ nm and values of $\lambda_{12}$, $\lambda_{13}$, $\lambda_{14}$, $\lambda_{22}$, $\lambda_{23}$, and $\lambda_{24}$ described below are determined from the view of the design of the display apparatus. In addition, the following expressions are satisfied.

$$2 \cdot L_{12}/\lambda_{12} + \phi_2/2\pi = 3 + \tfrac{1}{2}$$

$$2 \cdot L_{13}/\lambda_{13} + \phi_3/2\pi = 5$$

$$2 \cdot L_{14}/\lambda_{14} + \phi_4/2\pi = 8$$

$$2 \cdot L_{22}/\lambda_{22} + \phi_2/2\pi = 1 + \tfrac{1}{2}$$

$$2 \cdot L_{23}/\lambda_{23} + \phi_3/2\pi = 3$$

$$2 \cdot L_{24}/\lambda_{24} + \phi_4/2\pi = 5$$

where
$\lambda_{12} = 388$ nm $\leq \lambda_1 + 15 = 475$ nm;
$\lambda_{13} = 426$ nm $\leq \lambda_1 - 15 = 445$ nm;
$\lambda_{14} = 422$ nm $\geq \lambda_1 - 50 = 410$ nm;
$\lambda_{22} = 534$ nm $\leq \lambda_2 + 15 = 575$ nm;
$\lambda_{23} = 500$ nm $\leq \lambda_2 - 15 = 545$ nm; and
$\lambda_{24} = 548$ nm $\geq \lambda_2 - 50 = 510$ nm.

Accordingly, the expressions (C-1) and (C-2) are satisfied. It is preferable that $\lambda_{12} \neq \lambda_{13}$ and $\lambda_{22} \neq \lambda_{23}$ be satisfied.

Figure 1B:
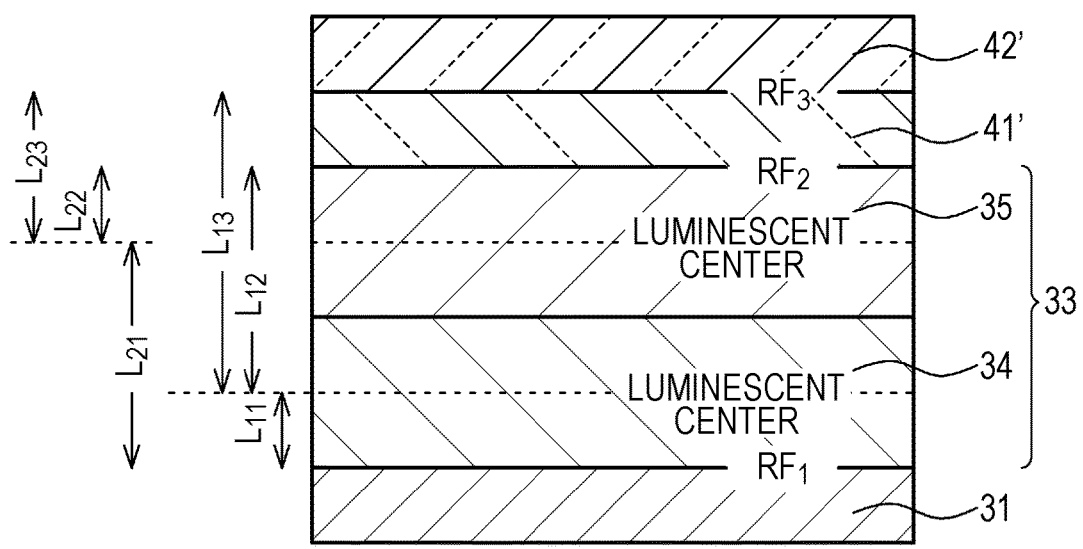

For comparison, as illustrated in a configuration diagram of the respective layers of FIG. 1B, a light-emitting device (light-emitting device of Comparative Example 1) is assumed in which only two layers of a first light-transmitting layer 41' and a second light-transmitting layer 42' are provided on a side of the second light-emitting layer 35 opposite to the first light-emitting layer 34 in order from the second light-emitting layer side. The light-emitting device of Comparative Example 1 satisfies all the expressions (1) to (6) and at least one of the expressions (7) and (8) disclosed in Japanese Unexamined Patent Application Publication No. 2011-159432. Various parameters such as the refractive indices $n_{00}$, $n_{01}$, and $n_{02}$ of the organic layer 33, the first light-transmitting layer 41', and the second light-transmitting layer 42' are as shown above in Table 1, specifically, except for values of $n_{03}$, $L_{14}$, and $L_{24}$.

Figure 3A:
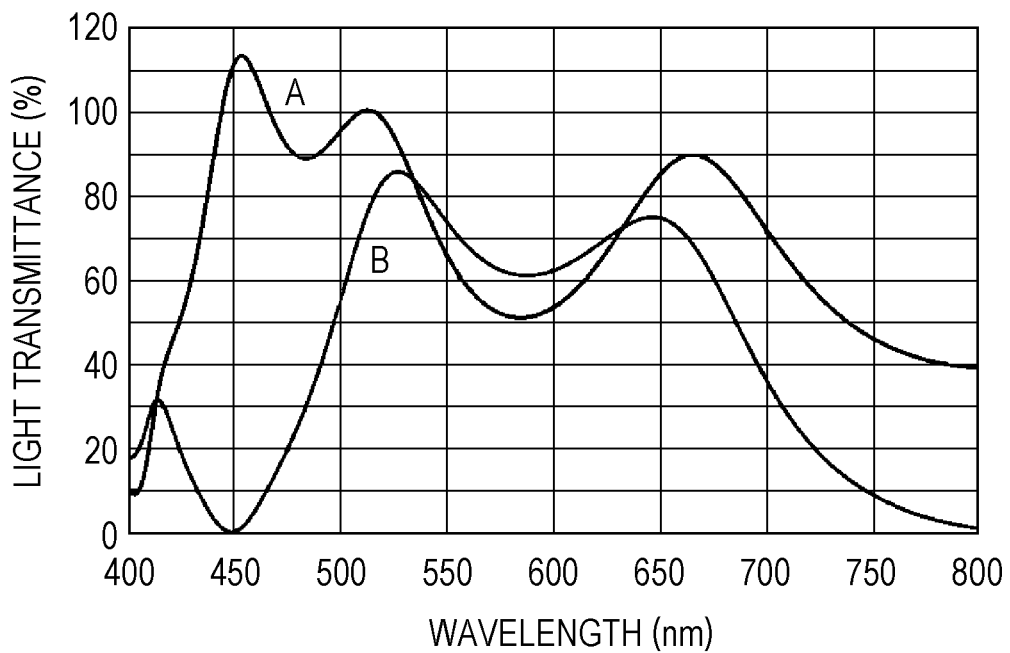
FIGS. 3A and 3B are graphs illustrating results of calculating light transmittances of interference filters of the light-emitting devices of Comparative Example 1 and Examples 1, respectively.
Figure 3B:
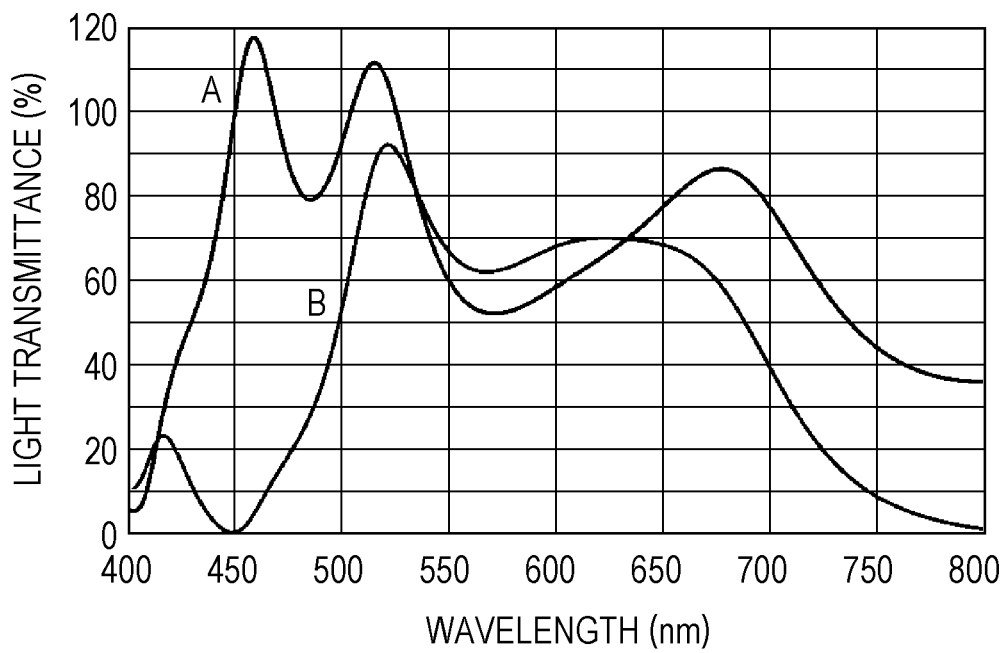

FIG. 3B illustrates results of calculating light transmittances of light (wavelength $\lambda_1$) emitted from the first light-emitting layer 34 and light (wavelength $\lambda_2$) emitted from the second light-emitting layer 35 in an interference filter which is formed by the first reflective interface $RF_1$, the second reflective interface $RF_2$, the third reflective interface $RF_3$, and the fourth reflective interface $RF_4$ of the light-emitting device of Example 1. Similarly, FIG. 3A illustrates results of calculating light transmittances of light (wavelength $\lambda_1$) emitted from the first light-emitting layer 34 and light (wavelength $\lambda_2$) emitted from the second light-emitting layer 35 in an interference filter which is formed by the first reflective interface $RF_1$, the second reflective interface $RF_2$, and the third reflective interface $RF_3$ of the light-emitting device of Comparative Example 1. In FIGS. 3A and 3B, data regarding the light emitted from the first light-emitting layer 34 is illustrated by solid line "A", and data regarding the light emitted from the second light-emitting layer 35 is illustrated by solid line "B".

Typically, when a yellow light-emitting layer capable of emitting green light and red light is used, white light can be emitted by using a blue light-emitting layer in combination. However, the color purity of a single color of green or red which is separated from white by a color filter is low. In addition, when the thickness of the color filter is increased to increase color gamut, the luminous efficiency is greatly decreased, which leads to an increase in power consumption and cost.

It can be seen from FIG. 3A that, in Comparative Example 1, a peak of the interference filter can be formed in a green wavelength region near 530 nm having high color purity by controlling the thickness of the second light-transmitting layer 42. As a result, the obtained color purity can be improved by the color filter or the like, and the color purity and the color gamut can be improved as the display apparatus. In addition, since an increase in the thickness of the color filter which is necessary for realizing the same level of chromaticity point as above does not occur, there are advantageous effects in terms of luminous efficiency and power consumption. However, in Comparative Example 1, the reinforced green wavelength region is wide, and the spectral transmittance of the interference filter forms a large valley in a wavelength region (a region of 550 nm to 650 nm) of curve B higher than 530 nm. Therefore, when the display apparatus is seen from the front, although the chromaticity is improved, the viewing-angle dependency of the chromaticity is large.

On the other hand, in Example 1, by providing the third light-transmitting layer 43 to form the fourth reflective interface $RF_4$, the interference of an opposite phase to the spectral transmittance of the interference filter is generated. Therefore, as illustrated in FIG. 3B, the spectral transmittance of the interference filter is flattened (refer to a region of curve B from 550 nm to 650 nm), and a wavelength region which should be reinforced to increase color gamut is narrowed. As a result, color gamut is increased and viewing-angle characteristics are improved. In addition, a position of the second reflective interface $RF_2$ is determined such that a peak position of a light transmittance of the interference filter is shifted from a peak of an emission spectrum of light emitted from the first light-emitting layer 34 and is shifted from a peak of an emission spectrum of light emitted from the second light-emitting layer 35. A position of the third reflective interface $RF_3$ is determined such that a peak position of a light transmittance of the interference filter is shifted from a peak of an emission spectrum of light emitted from the first light-emitting layer 34 and is shifted from a peak of an emission spectrum of light emitted from the second light-emitting layer 35. A position of the fourth reflective interface $RF_4$ is determined such that a peak position of a light transmittance of the interference filter is shifted from a peak of an emission spectrum of light emitted from the first light-emitting layer 34 and is shifted from a peak of an emission spectrum of light emitted from the second light-emitting layer 35. Therefore, the interference filter can function in a wider region.

Figure 4A:
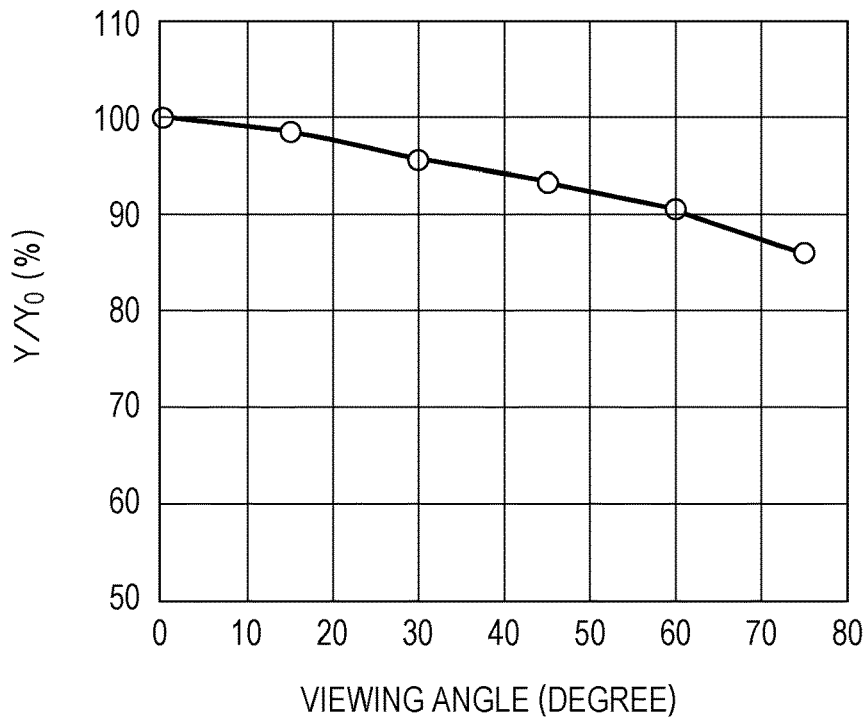
FIGS. 4A and 4B are a graph illustrating simulation results of a luminance change ($Y/Y_0$) in which a viewing angle is used as a parameter and a graph illustrating simulation results of a chromaticity change ($\Delta uv$) in which a viewing angle is used as a parameter, respectively, in the display apparatus of Example 1.
Figure 4B:
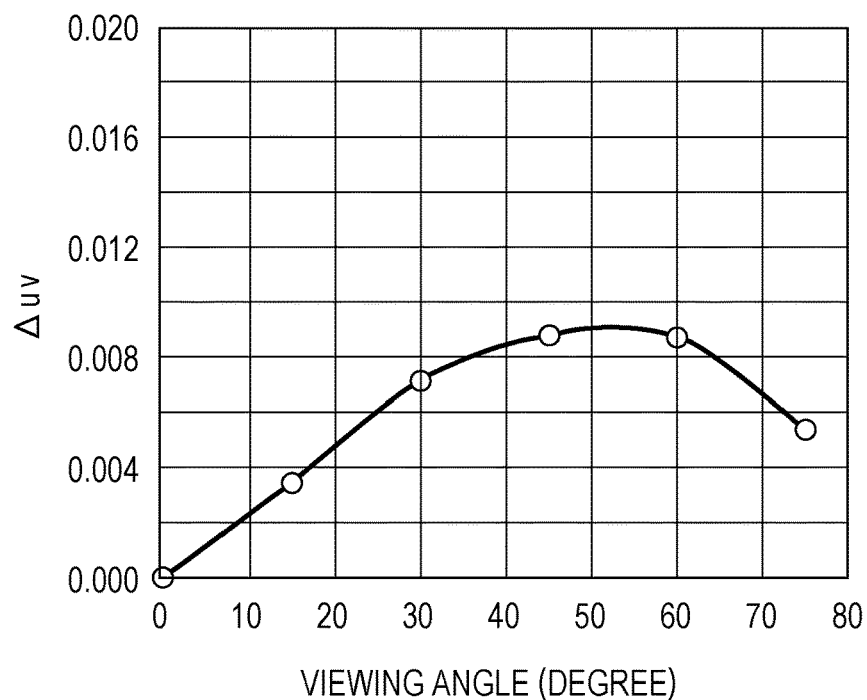

In addition, FIG. 4B illustrates simulation results of a luminance change ($Y/Y_0$) in which a viewing angle is used as a parameter in the display apparatus using the light-emitting device of Example 1, and FIG. 4B illustrates simulation results of a chromaticity change ($\Delta uv$) in which a viewing angle is used as a parameter in the display apparatus using the light-emitting device of Example 1. It can be seen from FIG. 4A that the luminance change can be maintained at 85% or higher at a viewing angle of 45°. It can be seen from FIG. 4B that the chromaticity change can satisfy $\Delta uv \leq 0.015$ at a viewing angle of 45°. That is, in Example 1, as clearly shown in FIGS. 4A and 4B, the viewing-angle dependency of the luminance change and the chromaticity change is low. Table 2 below shows the values of the chromaticity and the luminous efficiency of the light-emitting devices of Example 1 and Comparative Example 1. In the light-emitting device of Example 1, the x value is less than and the y value is greater than those of the light-emitting device of Comparative Example 1. Therefore, a more preferable chromaticity is exhibited, and the luminous efficiency is high.

TABLE 2

| | Chromaticity | | Luminous Efficiency |
|---|---|---|---|
| Example 1 | x = 0.294 | y = 0.683 | 1.03 |
| Comparative Example 1 | x = 0.307 | y = 0.672 | 1.00 |

In the light-emitting device of Example 1, an interference filter is formed by the first reflective interface $RF_1$, the second reflective interface $RF_2$, the third reflective interface $RF_3$, and the fourth reflective interface $RF_4$, and the expressions (1) and (2) are satisfied. As a result, reflection of light rays, which are emitted from the first light-emitting layer, on the first reflective interface $RF_1$ is reinforced, and reflection of light rays, which are emitted from the second light-emitting layer, on the first reflective interface $RF_1$ is reinforced. In addition, by satisfying either or both of the expressions (3-1) and (3-B), that is, by appropriately combining conditions of reinforcing and weakening the reflection of the interference filter with each other, an interference filter in which a light transmittance curve is more flat in a wide wavelength region can be obtained. Further, a light transmittance of the interference filter can be increased in either or both of a narrow wavelength region corresponding to light emitted from the first light-emitting layer and a narrow wavelength region corresponding to light emitted from the second light-emitting layer. As a result, monochrome chromaticity can be improved, color gamut can be increased, a white light-emitting device having superior hue and low power consumption can be provided, and a viewing-angle dependency of luminance and chromaticity with respect to light of a single color or a combined color of two or more different colors in the visible wavelength region can be greatly decreased. Alternatively, since the first reflective interface, the second reflective interface, the third reflective interface, and the fourth reflective interface are arranged so as to satisfy the predetermined conditions, an interference filter in which a light transmittance curve is more flat in a wide wavelength region can be obtained, and a white light-emitting device having superior hue and low power consumption can be provided. Furthermore, a light transmittance of the interference filter can be increased in either or both of a narrow wavelength region corresponding to light emitted from the first light-emitting layer and a narrow wavelength region corresponding to light emitted from the second light-emitting layer. As a result, monochrome chromaticity can be improved, color gamut can be increased, and a viewing-angle dependency of luminance and chromaticity with respect to light of a single color or a combined color of two or more different colors in the visible wavelength region can be greatly decreased.

Example 2

Example 2 is a modification of Example 1. When the light-emitting layer is a heterochromatic light-emitting layer, specifically, for example, when one light-emitting layer in which a green light-emitting layer and a red light-emitting layer are stacked is formed, it is difficult to reduce the thicknesses of a first color light-emitting layer and a color second light-emitting layer to the extent that it can be determined that luminescent centers of the heterochromatic light-emitting layer are at one level. That is, from the view of the design of the light-emitting device or the display apparatus or from the view of the manufacturing process, it is necessary that the thicknesses of the first color light-emitting layer and the second color light-emitting layer included in the single light-emitting layer be increased. Therefore, it is difficult to determine that luminescent centers of the heterochromatic light-emitting layer are at one level. For example, a difference between the luminescent center of the first color (green) and the luminescent center of the second color (red) in the heterochromatic light-emitting layer (specifically, in Example 2, the second light-emitting layer 35) may be 5 nm or greater. In addition, for example, depending on the material forming the light-emitting layer, it is necessary that the stacking order of the first color light-emitting layer and the second color light-emitting layer in the heterochromatic light-emitting layer be changed. Therefore, it is difficult to determine that luminescent centers of the heterochromatic light-emitting layer are at one level.

In this case, in each of the luminescent center of the first color and the luminescent center of the second color of the light-emitting layer, various parameters may be determined so as to satisfy the expressions (1) and (2) and satisfy either or both of the expressions (3-A) and (3-B). Alternatively, when it is determined that luminescent centers of the heterochromatic light-emitting layer are not at one level as described above, a fourth light-transmitting layer may be further provided. Alternatively, for example, the second reflective interface may include plural interfaces. For example, in a wavelength region of about 550 nm to 650 nm, a change of a light transmittance curve of green light, which is emitted from the green light-emitting layer to the outside of the light-emitting device, in the interference filter in which a wavelength is used as a variable has the same tendency as that of a change of a light transmittance curve of red light, which is emitted from the red light-emitting layer to the outside of the light-emitting device, in the interference filter in which a wavelength is used as a variable. As a result, even when the viewing angle is increased, a ratio of the luminance decrease of the green light and a ratio of the luminance decrease of the red light are at the same level, and thus a chromaticity shift is not increased.

Example 3

Example 3 is a modification of Example 1 or 2 and relates to the bottom emission type display apparatus. As illustrated in a partial schematic cross-sectional view of FIG. 5, the light-emitting device 10 of Example 3 is the bottom emission type in which the second electrode 32, the organic layer 33, and the first electrode 31 are stacked in this order on the first substrate 11. Light emitted from the light-emitting layer is emitted to the outside through the first substrate 11. Although not illustrated, a transparent conductive material layer having a thickness of 1 µm or greater, a transparent insulating layer having a thickness of 1 µm or greater, a resin layer having a thickness of 1 µm or greater, a glass layer having a thickness of 1 µm or greater, or an air layer having a thickness of 1 µm or greater may be further formed on a side of the third light-transmitting layer opposite to the second light-transmitting layer, that is, may be further formed between the third light-transmitting layer 43 and the first substrate 11. The outermost layer above the first electrode 31 is the second substrate 12. The first electrode 31 and the second substrate 12 are bonded to each other through an adhesion layer 29.

Example 4

Figure 6:
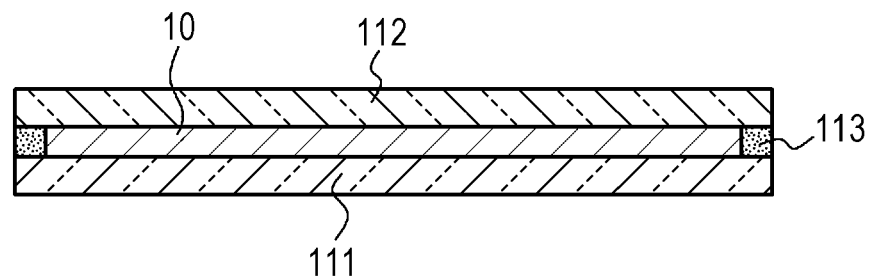
FIG. 6 is a cross-sectional view schematically illustrating a part of an illumination apparatus of Example 4.

Example 4 relates to the illumination apparatus according to the embodiment. As illustrated in a schematic cross-sectional view of FIG. 6, in the illumination apparatus of Example 4, the light-emitting device 10 described in Examples 1 to 3 is disposed between a first substrate 111 and a second substrate 112 which are transparent. Depending on the structure of the light-emitting device 10, light is emitted from the light-emitting layer to the second substrate or to the first substrate. An outer periphery of the first substrate 111 and an outer periphery of the second substrate 112 are bonded to each other through a sealing member 113. A planar shape of the illumination apparatus is selected as necessary and, for example, is square or rectangular. In FIG. 6, one light-emitting device 10 is illustrated. However, as necessary, plural light-emitting devices may be arranged in a desired pattern. Since the illumination apparatus itself has existing configuration and structure, the details thereof will not be described.

In the illumination apparatus of Example 4, by using the light-emitting devices of Example 1 to 3, an illumination apparatus (for example, a surface emission light source) having low angle dependency, that is, extremely low changes in intensity and chromaticity depending on an illumination direction and having superior light distribution characteristics can be realized. In addition, an illumination apparatus having superior color rendering properties and superior light distribution characteristics can be realized. In addition, by selecting colors of light emitted from the light-emitting device, not only white light but light of various colors can be obtained.

Hereinabove, the preferable Examples of the present disclosure have been described, but the content of the present disclosure is not limited to these Examples. The configurations and the structures of the light-emitting devices, the display apparatus, and the illumination apparatus described in the Examples are merely exemplary and can be appropriately changed.

The present disclosure can adopt the following configurations.

[A01] Light-Emitting Device . . . First Embodiment
A light-emitting device including:
a first electrode;
a second electrode; and
an organic layer that is provided between the first electrode and the second electrode and is formed by stacking a first light-emitting layer and a second light-emitting layer in order from the first electrode side,
in which light emitted from the organic layer is reflected by an interface between the first light-emitting layer and the first electrode, passes through the second electrode, and is emitted to the outside of the light-emitting device,
a first light-transmitting layer, a second light-transmitting layer, and a third light-transmitting layer are provided on a side of the second light-emitting layer opposite to the first light-emitting layer in order from the second light-emitting layer side,
the following expressions (1) and (2) are satisfied, and either or both of the following expressions (3-A) and (3-B) are satisfied.

$$(-\phi_1/2\pi+m_1)\cdot(\lambda_1-150)/2 \leq L_{11} \leq (-\phi_1/2\pi+m_1)\cdot(\lambda_1+80)/2 \quad (1)$$

$$(-\phi_1/2\pi+n_1)\cdot(\lambda_2-30)/2 \leq L_{21} \leq (-\phi_1/2\pi+n_1)\cdot(\lambda_2+80)/2 \quad (2)$$

$$L_{12} \leq (-\phi_2/2\pi+m_2+\tfrac{1}{2})\cdot(\lambda_1+15)/2,\ L_{13} \leq (-\phi_3/2\pi+m_3)\cdot(\lambda_1-15)/2,\ \text{and}\ (-\phi_4/2\pi+m_4)\cdot(\lambda_1-50)/2 \leq L_{14} \quad \text{(3-A)}$$

$$L_{22} \leq (-\phi_2/2\pi+n_2+\tfrac{1}{2})\cdot(\lambda_2+15)/2,\ L_{23} \leq (-\phi_3/2\pi+n_3)\cdot(\lambda_2-15)/2,\ \text{and}\ (-\phi_4/2\pi+n_4)\cdot(\lambda_2-50)/2 \leq L_{24} \quad \text{(3-B)}$$

Where
$\lambda_1$ is a central wavelength (unit: nm) of an emission wavelength region of the first light-emitting layer,
$\lambda_2$ is a central wavelength (unit: nm) of an emission wavelength region of the second light-emitting layer,
$L_{11}$ is an optical distance (unit: nm) between a first reflective interface, which is the interface between the first light-emitting layer and the first electrode, and a luminescent center of the first light-emitting layer,
$L_{12}$ is an optical distance (unit: nm) between a second reflective interface, which is an interface between the second light-emitting layer and the first light-transmitting layer, and the luminescent center of the first light-emitting layer,
$L_{13}$ is an optical distance (unit: nm) between a third reflective interface, which is an interface between the first light-transmitting layer and the second light-transmitting layer, and the luminescent center of the first light-emitting layer,
$L_{14}$ is an optical distance (unit: nm) between a fourth reflective interface, which is an interface between the second light-transmitting layer and the third light-transmitting layer, and the luminescent center of the first light-emitting layer,
$L_{21}$ is an optical distance (unit: nm) between the first reflective interface and a luminescent center of the second light-emitting layer,
$L_{22}$ is an optical distance (unit: nm) between the second reflective interface and the luminescent center of the second light-emitting layer,
$L_{23}$ is an optical distance (unit: nm) between the third reflective interface and the luminescent center of the second light-emitting layer,
$L_{24}$ is an optical distance (unit: nm) between the fourth reflective interface and the luminescent center of the second light-emitting layer,
$\phi_1$ is a phase shift (unit: radian) occurring when light is reflected by the first reflective interface,
$\phi_2$ is a phase shift (unit: radian) occurring when light is reflected by the second reflective interface,
$\phi_3$ is a phase shift (unit: radian) occurring when light is reflected by the third reflective interface,
$\phi_4$ is a phase shift (unit: radian) occurring when light is reflected by the fourth reflective interface,
$m_1$ is an integer of 0 or more,
$n_1$ is an integer of 0 or more, and
$m_2$, $m_3$, $m_4$, $n_2$, $n_3$, and $n_4$ are integers.

[A02] The light-emitting device according to [A01],
in which $m_1=0$ and $n_1=1$.

[A03] The light-emitting device according to [A01] or [A02],
in which an interference filter is formed by the first reflective interface, the second reflective interface, the third reflective interface, and the fourth reflective interface.

[A04] The light-emitting device according to any one of [A01] to [A03],
in which a difference between a refractive index of the organic layer and a refractive index of the first light-transmitting layer is 0.15 or greater,
a difference between the refractive index of the first light-transmitting layer and a refractive index of the second light-transmitting layer is 0.15 or greater, and
a difference between the refractive index of the second light-transmitting layer and a refractive index of the third light-transmitting layer is 0.15 or greater.

[A05] The light-emitting device according to any one of [A01] to [A04],
in which an optical thickness $t_2$ of the second light-transmitting layer satisfies $0.2\cdot\lambda_1 \leq t_2 \leq 0.35\cdot\lambda_1$.

[A06] The light-emitting device according to any one of [A01] to [A05],
in which a luminance at a viewing angle of 45° is decreased by 30% or lower compared to a luminance at a viewing angle of 0°.

[A07] The light-emitting device according to any one of [A01] to [A06],
in which a chromaticity shift Δuv at a viewing angle of 45° is 0.015 or lower.

[A08] The light-emitting device according to any one of [A01] to [A07],
in which a metal layer having a thickness of 5 nm or less is provided between the second light-emitting layer and the first light-transmitting layer.

[A09] The light-emitting device according to any one of [A01] to [A08],
in which the second reflective interface, the third reflective interface, or the fourth reflective interface includes plural interfaces.

[A10] The light-emitting device according to any one of [A01] to [A09],
in which at least one of the first light-emitting layer and the second light-emitting layer is a heterochromatic light-emitting layer that emits light of two or more different colors, and
when it is determined that luminescent centers of the heterochromatic light-emitting layer are not at one level, a fourth light-transmitting layer is further provided.

[A11] The light-emitting device according to [A10],
in which an interference filter is formed by the first reflective interface, the second reflective interface, the third reflective interface, the fourth reflective interface, and a fifth reflective interface,
the first reflective interface is the interface between the first light-emitting layer and the first electrode,
the second reflective interface is formed by the second light-emitting layer, the first light-transmitting layer, the second light-transmitting layer, the third light-transmitting layer, and the fourth light transmitting layer, and a change of a light transmittance curve of a light ray, which is emitted from the heterochromatic light-emitting layer to the outside of the light-emitting device, in the interference filter in which a wavelength is used as a variable has the same tendency as that of a change of a light transmittance curve of another light ray, which is emitted from the heterochromatic light-emitting layer to the outside of the light-emitting device, in the interference filter in which a wavelength is used as a variable.

[A12] The light-emitting device according to any one of [A01] to [A11], in which the first electrode, the organic layer, and the second electrode are stacked in this order on a substrate.

[A13] The light-emitting device according to [A12], in which a transparent conductive material layer having a thickness of 0.5 μm or greater, a transparent insulating layer having a thickness of 0.5 μm or greater, a resin layer having a thickness of 0.5 μm or greater, a glass layer having a thickness of 0.5 μm or greater, or an air layer having a thickness of 0.5 μm or greater is further formed on a side of the third light-transmitting layer opposite to the second light-transmitting layer.

[A14] The light-emitting device according to any one of [A01] to [A11], in which the second electrode, the organic layer, and the first electrode are stacked in this order on a substrate.

[A15] The light-emitting device according to [A14], in which a transparent conductive material layer having a thickness of 1 μm or greater, a transparent insulating layer having a thickness of 1 μm or greater, a resin layer having a thickness of 1 μm or greater, a glass layer having a thickness of 1 μm or greater, or an air layer having a thickness of 1 μm or greater are formed on a side of the third light-transmitting layer opposite to the second light-transmitting layer.

[B01] Light-Emitting Device . . . Second Embodiment

A light-emitting device including:

a first electrode;

a second electrode; and an organic layer that is provided between the first electrode and the second electrode and is formed by stacking a first light-emitting layer and a second light-emitting layer in order from the first electrode side, in which light emitted from the organic layer is reflected by a first reflective interface formed between the first light-emitting layer and the first electrode, passes through the second electrode, and is emitted to the outside of the light-emitting device, a first light-transmitting layer, a second light-transmitting layer, and a third light-transmitting layer are provided on a side of the second light-emitting layer opposite to the first light-emitting layer in order from the second light-emitting layer side, a second reflective interface is formed at an interface of the first light-transmitting layer on the second light-emitting layer side, a third reflective interface is formed between the first light-transmitting layer and the second light-transmitting layer, a fourth reflective interface is formed between the second light-transmitting layer and the third light-transmitting layer, an interference filter is formed by the first reflective interface, the second reflective interface, the third reflective interface, and the fourth reflective interface, the first reflective interface is arranged so as to satisfy the following (Condition-1), and the second reflective interface, the third reflective interface, and the fourth reflective interface are arranged so as to satisfy either or both of the following (Condition-2) and (Condition-3).

(Condition-1)

reflection of light rays, which are emitted from the first light-emitting layer, on the first reflective interface is reinforced, and reflection of light rays, which are emitted from the second light-emitting layer, on the first reflective interface is reinforced.

(Condition-2)

reflection of light rays, which are emitted from the first light-emitting layer, on the second reflective interface is weakened, reflection of light rays, which are emitted from the first light-emitting layer, on the third reflective interface is reinforced, and reflection of light rays, which are emitted from the first light-emitting layer, on the fourth reflective interface is reinforced, (Condition-3)

reflection of light rays, which are emitted from the second light-emitting layer, on the second reflective interface is weakened, reflection of light rays, which are emitted from the second light-emitting layer, on the third reflective interface is reinforced, and reflection of light rays, which are emitted from the second light-emitting layer, on the fourth reflective interface is reinforced.

[B02] The light-emitting device according to [B01], in which a position of the second reflective interface is determined such that a peak position of a light transmittance of the interference filter is shifted from a peak of an emission spectrum of light emitted from the first light-emitting layer and is shifted from a peak of an emission spectrum of light emitted from the second light-emitting layer.

[B03] The light-emitting device according to [B01] or [B02], in which a position of the third reflective interface is determined such that a peak position of a light transmittance of the interference filter is shifted from a peak of an emission spectrum of light emitted from the first light-emitting layer and is shifted from a peak of an emission spectrum of light emitted from the second light-emitting layer.

[B04] The light-emitting device according to any one of [B01] to [B03], in which a position of the fourth reflective interface is determined such that a peak position of a light transmittance of the interference filter is shifted from a peak of an emission spectrum of light emitted from the first light-emitting layer and is shifted from a peak of an emission spectrum of light emitted from the second light-emitting layer.

[B05] The light-emitting device according to any one of [B01] to [B04], in which a difference between a refractive index of the organic layer and a refractive index of the first light-transmitting layer is 0.15 or greater, a difference between the refractive index of the first light-transmitting layer and a refractive index of the second light-transmitting layer is 0.15 or greater, and a difference between the refractive index of the second light-transmitting layer and a refractive index of the third light-transmitting layer is 0.15 or greater.

[B06] The light-emitting device according to any one of [B01] to [B05],
in which a luminance at a viewing angle of 45° is decreased by 30% or lower compared to a luminance at a viewing angle of 0°.

[B07] The light-emitting device according to any one of [B01] to [B06],
in which a chromaticity shift Δuv at a viewing angle of 45° is 0.015 or lower.

[B08] The light-emitting device according to any one of [B01] to [B07],
in which a metal layer having a thickness of 5 nm or less is provided between the second light-emitting layer and the first light-transmitting layer.

[B09] The light-emitting device according to any one of [B01] to [B08],
in which the second reflective interface, the third reflective interface, or the fourth reflective interface includes plural interfaces.

[B10] The light-emitting device according to any one of [B01] to [B09],
in which at least one of the first light-emitting layer and the second light-emitting layer is a heterochromatic light-emitting layer that emits light of two or more different colors, and
when it is determined that luminescent centers of the heterochromatic light-emitting layer are not at one level, a fourth light-transmitting layer is further provided.

[B11] The light-emitting device according to [B10],
in which a fourth light-transmitting layer is further provided, and
a change of a light transmittance curve of a light ray, which is emitted from the heterochromatic light-emitting layer to the outside of the light-emitting device, in the interference filter in which a wavelength is used as a variable has the same tendency as that of a change of a light transmittance curve of another light ray, which is emitted from the heterochromatic light-emitting layer to the outside of the light-emitting device, in the interference filter in which a wavelength is used as a variable.

[B12] The light-emitting device according to any one of [B01] to [B11],
in which the first electrode, the organic layer, and the second electrode are stacked in this order on a substrate.

[B13] The light-emitting device according to [B12],
in which a transparent conductive material layer having a thickness of 0.5 μm or greater, a transparent insulating layer having a thickness of 0.5 μm or greater, a resin layer having a thickness of 0.5 μm or greater, a glass layer having a thickness of 0.5 μm or greater, or an air layer having a thickness of 0.5 μm or greater is further formed on a side of the third light-transmitting layer opposite to the second light-transmitting layer.

[B14] The light-emitting device according to any one of [B01] to [B11],
in which the second electrode, the organic layer, and the first electrode are stacked in this order on a substrate.

[B15] The light-emitting device according to [B14],
in which a transparent conductive material layer having a thickness of 1 μm or greater, a transparent insulating layer having a thickness of 1 μm or greater, a resin layer having a thickness of 1 μm or greater, a glass layer having a thickness of 1 μm or greater, or an air layer having a thickness of 1 μm or greater are formed on a side of the third light-transmitting layer opposite to the second light-transmitting layer.

[C01] Display Apparatus
A display apparatus obtained by arranging the plural light-emitting devices according to any one of [A01] to [B15] in a two-dimensional matrix.

[C02] Illumination Apparatus
An illumination apparatus including the light-emitting device according to any one of [A01] to [B15].

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A light-emitting device comprising: a first electrode; a second electrode; and an organic layer that is provided between the first electrode and the second electrode and is formed by stacking a first light-emitting layer and a second light-emitting layer in order from the first electrode side,
wherein light emitted from the organic layer is reflected by a first reflective interface formed between the first light-emitting layer and the first electrode, passes through the second electrode, and is emitted to the outside of the light-emitting device,
a first light-transmitting layer, a second light-transmitting layer, and a third light-transmitting layer are provided on a side of the second light-emitting layer opposite to the first light-emitting layer in order from the second light-emitting layer side,
a second reflective interface is formed at an interface of the first light-transmitting layer on the second light-emitting layer side,
a third reflective interface is formed between the first light-transmitting layer and the second light-transmitting layer,
a fourth reflective interface is formed between the second light-transmitting layer and the third light-transmitting layer,
an interference filter is formed by the first reflective interface, the second reflective interface, the third reflective interface, and the fourth reflective interface,
the first reflective interface is arranged so as to satisfy a first condition, and
the second reflective interface, the third reflective interface, and the fourth reflective interface are arranged so as to satisfy either or both of a second condition and a third condition,
wherein the first condition is that reflection of light rays, which are emitted from the first light-emitting layer, on the first reflective interface is reinforced, and reflection of light rays, which are emitted from the second light-emitting layer, on the first reflective interface is reinforced,
wherein the second condition is that reflection of light rays, which are emitted from the first light-emitting layer, on the second reflective interface is weakened, reflection of light rays, which are emitted from the first light-emitting layer, on the third reflective interface is reinforced, and reflection of light rays, which are emitted from the first light-emitting layer, on the fourth reflective interface is reinforced, and wherein the third condition is that reflection of light rays, which are emitted from the second light-emitting layer, on the second reflective interface is weakened, reflection of light rays, which are emitted from the second light-emitting layer, on the third reflective interface is reinforced, and reflection of light rays, which are emitted from the second light-emitting layer, on the fourth reflective interface is reinforced.

2. The light-emitting device according to claim 1, wherein a position of the second reflective interface is determined such that a peak position of light transmittance of the interference filter is shifted from a peak of an emission spectrum of light emitted from the first light-emitting layer and is shifted from a peak of an emission spectrum of light emitted from the second light-emitting layer.

3. The light-emitting device according to claim 1, wherein a position of the third reflective interface is determined such that a peak position of a light transmittance of the interference filter is shifted from a peak of an emission spectrum of light emitted from the first light-emitting layer and is shifted from a peak of an emission spectrum of light emitted from the second light-emitting layer.

4. The light-emitting device according to claim 1, wherein a position of the fourth reflective interface is determined such that a peak position of a light transmittance of the interference filter is shifted from a peak of an emission spectrum of light emitted from the first light-emitting layer and is shifted from a peak of an emission spectrum of light emitted from the second light-emitting layer.

\* \* \* \* \*